US012727173B2

(12) United States Patent
Chen et al.

(10) Patent No.: US 12,727,173 B2
(45) Date of Patent: Sep. 1, 2026

(54) MEMORY DEVICE STRUCTURE AND FABRICATION METHOD

(71) Applicant: Yangtze Memory Technologies Co., Ltd., Wuhan (CN)

(72) Inventors: Liang Chen, Wuhan (CN); Wei Liu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 777 days.

(21) Appl. No.: 18/089,991

(22) Filed: Dec. 28, 2022

(65) Prior Publication Data

US 2024/0196631 A1 Jun. 13, 2024

(30) Foreign Application Priority Data

Dec. 9, 2022 (CN) ........................ 202211583578.5

(51) Int. Cl.
*H10B 80/00* (2023.01)

(52) U.S. Cl.
CPC .................................... *H10B 80/00* (2023.02)

(58) Field of Classification Search
CPC ........ H10B 80/00; H10B 43/27; H10B 43/40; H10B 43/50; C11C 5/02; C11C 5/12
See application file for complete search history.

(56) References Cited

U.S. PATENT DOCUMENTS

2022/0122932 A1* 4/2022 Oh .......................... H01L 24/08
2022/0293619 A1* 9/2022 Kim ....................... H10B 43/27

* cited by examiner

*Primary Examiner* — Timor Karimy
(74) *Attorney, Agent, or Firm* — Anova Law Group, PLLC

(57) ABSTRACT

A method for forming a 3D memory device includes forming an array wafer based on a first substrate having at least one cell region for forming a plurality of memory cells and at least one string structure region for forming a string structure; forming a first complementary metal-oxide-semiconductor (CMOS) wafer based on a second substrate having at least one string driver region corresponding to the at least one string structure region, and at least one page buffer high-voltage (HV) circuit region corresponding to the at least one cell region; forming a second CMOS wafer based on a third substrate having at least one page buffer region corresponding to the at least one cell region; and forming the 3D memory device based on the array wafer, the first CMOS wafer, and the second CMOS wafer stacked together.

16 Claims, 22 Drawing Sheets

100

310

Memory Array 102

330

LLV circuitry 202 | LV circuitry 204

320

HV circuitry 206

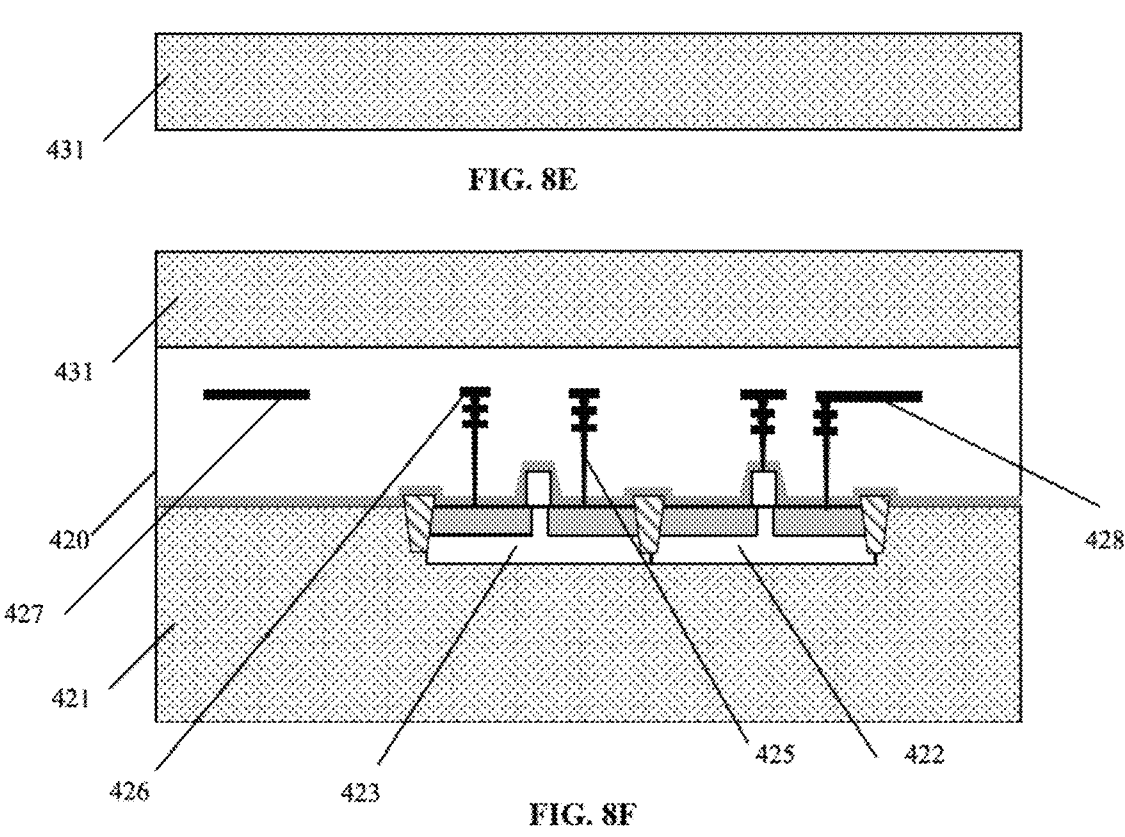
FIG. 8E
FIG. 8F
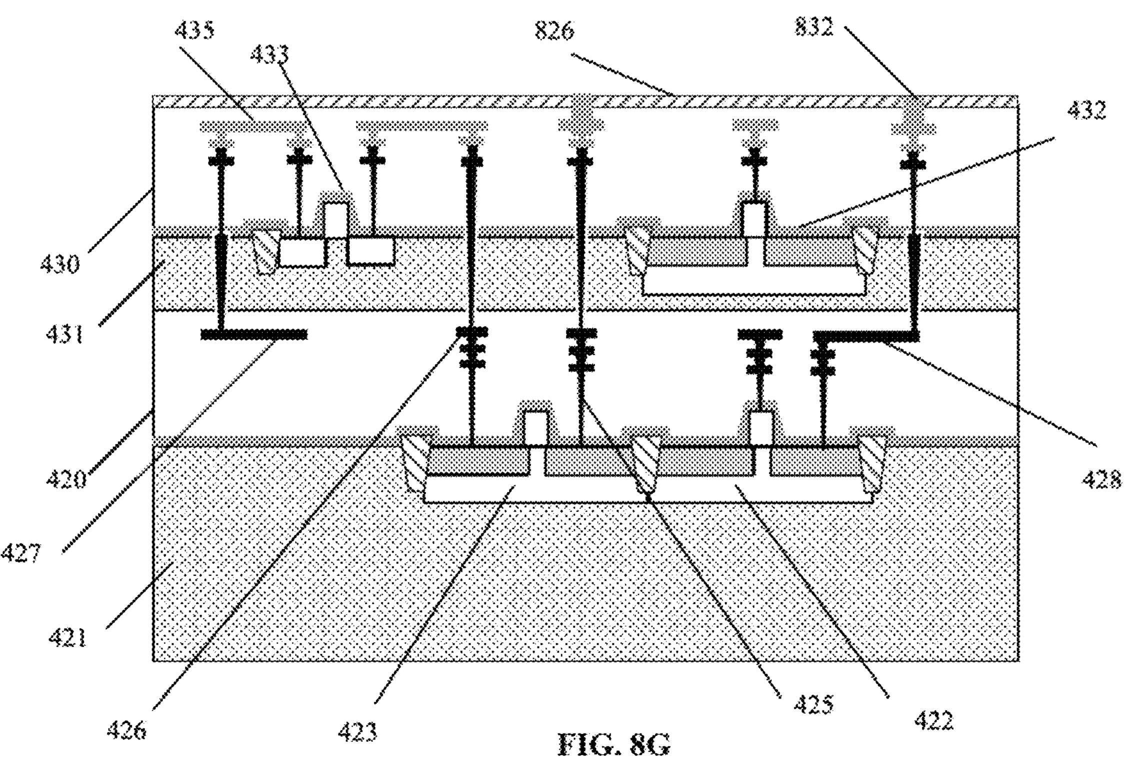
FIG. 8G

MEMORY DEVICE STRUCTURE AND FABRICATION METHOD

CROSS-REFERENCE TO RELATED APPLICATION

This application claims the priority to Chinese Patent Application No. 202211583578.5, filed on Dec. 9, 2022, the content of which is incorporated herein by reference in its entirety.

FIELD OF THE DISCLOSURE

The present disclosure generally relates to the field of memory device and, more particularly, relates to a memory device structure and fabrication method thereof.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit. 3D memory architecture can address the density limitation in planar memory cells. 3D memory architecture includes a memory array and peripheral devices for controlling signals to and from the memory array.

For 3D NAND memory devices, the peripheral devices are often located in a complementary metal-oxide-semiconductor (CMOS) area. As the number of 3D NAND layers continues to increase, the memory array size under the same capacity continues to decrease, which also requires the CMOS area to continue to shrink. Often more than one CMOS areas are used. Such requirement is often challenging when designing and fabricating the 3D NAND memory devices. The disclosed devices and fabrication methods are directed to solve one or more problems set forth above and other problems in the art.

BRIEF SUMMARY OF THE DISCLOSURE

One aspect of the present disclosure provides a method for forming a 3D memory device. The method includes forming an array wafer based on a first substrate having at least one cell region for forming a plurality of memory cells and at least one string structure region for forming a string structure, including: forming the plurality of memory cells in the at least one cell region, and forming the string structure in the at least one string structure region. The method also includes forming a first complementary metal-oxide-semiconductor (CMOS) wafer based on a second substrate having at least one string driver region corresponding to the at least one string structure region, and at least one page buffer high-voltage (HV) circuit region corresponding to the at least one cell region, including: forming HV circuits of a string driver in the at least one string driver region, and forming HV circuits of page buffers in the at least one page buffer HV circuit region. The method also includes forming a second CMOS wafer based on a third substrate having at least one page buffer region corresponding to the at least one cell region, including forming low-voltage (LV) circuits of the page buffers in the at least one page buffer region. Further, the method includes forming the 3D memory device based on the array wafer, the first CMOS wafer, and the second CMOS wafer, and the array wafer, the first CMOS wafer, and the second CMOS wafer are stacked together.

Another aspect of the present disclosure provides a 3D memory device. The 3D memory device includes an array wafer including a first substrate having at least one cell region and at least one string structure region, a plurality of memory cells formed in the at least one cell region, and a string structure formed in the at least one string structure region; a first complementary metal-oxide-semiconductor (CMOS) wafer including a second substrate having at least one string driver region corresponding to the at least one string structure region and at least one page buffer high-voltage (HV) circuit region corresponding to the at least one cell region, HV circuits of a string driver formed in the at least one string driver region, and HV circuits of page buffers formed in the at least one page buffer HV circuit region; and a second CMOS wafer including a third substrate having at least one page buffer region corresponding to the at least one cell region, and low-voltage (LV) circuits of the page buffers formed in the at least one page buffer region. The array wafer, the first CMOS wafer, and the second CMOS wafer are stacked together.

Another aspect of the present disclosure provides a memory system. The memory system includes a 3D memory device, a memory controller coupled to the 3D memory device for controlling the 3D memory device, and an external interface for communicating with a host for storing information in the 3D memory device. The 3D memory device includes an array wafer, a first complementary metal-oxide-semiconductor (CMOS) wafer, and a second CMOS wafer stacked together. The array wafer includes a first substrate having at least one cell region and at least one string structure region, a plurality of memory cells formed in the at least one cell region, and a string structure formed in the at least one string structure region. The first CMOS wafer includes a second substrate having at least one string driver region corresponding to the at least one string structure region and at least one page buffer high-voltage (HV) circuit region corresponding to the at least one cell region, HV circuits of a string driver formed in the at least one string driver region, and HV circuits of page buffers formed in the at least one page buffer HV circuit region. The second CMOS wafer includes a third substrate having at least one page buffer region corresponding to the at least one cell region, and low-voltage (LV) circuits of the page buffers formed in the at least one page buffer region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIGS. 8A-8I illustrate various fabrication stages of a fabrication process consistent with various disclosed embodiments in the present disclosure;

DETAILED DESCRIPTION

Figure 1A:
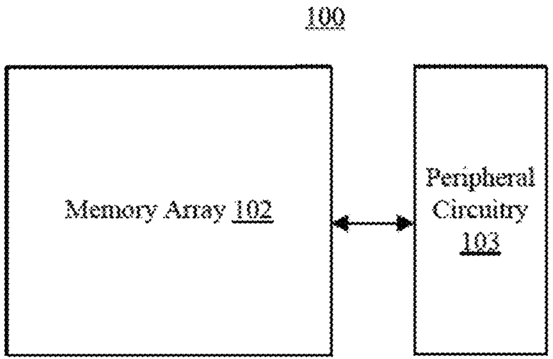
FIG. 1A illustrates a block diagram of a 3D memory device consistent with various disclosed embodiments in the present disclosure.

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment," "an embodiment," "an exemplary embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. The term "vertical" refers to the direction perpendicular to the surface of a semiconductor substrate, and the term "horizontal" refers to any direction that is parallel to the surface of that semiconductor substrate.

As used herein, the term "3D memory device" refers to a semiconductor device with vertically oriented strings of memory cell transistors (referred to herein as "memory strings", such as NAND strings) on a laterally-oriented substrate so that the memory strings extend in the vertical direction with respect to the substrate.

FIG. 1A illustrates a block diagram of a 3D memory device 100 consistent with the disclosed embodiments of the present disclosure. In certain embodiments, the 3D memory device 100 be a 3D NAND memory device. 3D NAND is a flash memory technology which stacks memory cells vertically to increase capacity for higher storage density and lower cost per gigabyte.

Figure 1B:
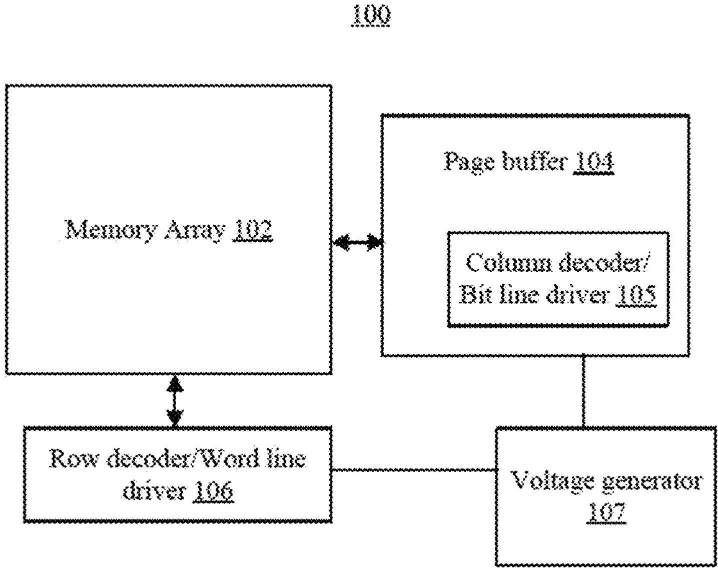
FIG. 1B illustrates certain devices included in the peripheral circuitry of a 3D memory device consistent with various disclosed embodiments in the present disclosure.

As shown in FIG. 1A, the 3D memory device (i.e., a 3D NAND memory device) 100 may include a memory cell array 102 (or simply memory array 102) and peripheral circuitry 103 coupled to the memory cell array 102. The memory cell array 102 may be a NAND flash memory cell array, in which memory cells are provided in the form of an array of NAND memory strings, each of which extends vertically above a substrate (not shown). In some implementations, each NAND memory string includes multiple memory cells coupled in series and stacked vertically. Each memory cell may hold a continuous analog value, such as a voltage or charge, depending on the number of electrons trapped within the area of the memory cells. The peripheral circuitry 103 may include supporting circuits for the memory array 102 to form the 3D memory 100. FIG. 1B illustrates certain devices included in the peripheral circuitry 103 consistent with the disclosed embodiments.

As shown in FIG. 1B, for example, the peripheral circuitry 103 may include a page buffer 104, which may include a column decoder/bit line driver 105, coupled to the memory cells, and a row decoder/word line driver 106 coupled to the string structure of the memory array for memory operations. The peripheral circuitry 103 may also include a voltage generator 107 for providing varies voltages for the peripheral circuitry 103, including the page buffer 104, column decoder/bit line driver 105, and row decoder/word line driver 106. Other devices are also be included in the peripheral circuitry 103.

The devices in the peripheral circuitry 103 may needed to be operated at different voltage levels. The voltages provided by voltage generator 107 to, for example, row decoder/word line drivers 106, column decoder/bit line drivers 105, and page buffer 104 may need to be above certain levels sufficient to perform a memory operation. For example, the voltage provided to the buffer circuitry in the page buffer 104 and/or the other logic circuitry may be between 2V and 3.3V, such as 3.3V, and the voltage provided to the drive circuitry in the row decoder/word line drivers 106 and/or the column decoder/bit line drivers 105 may be between 5V and 30V.

Figures 2, 3:
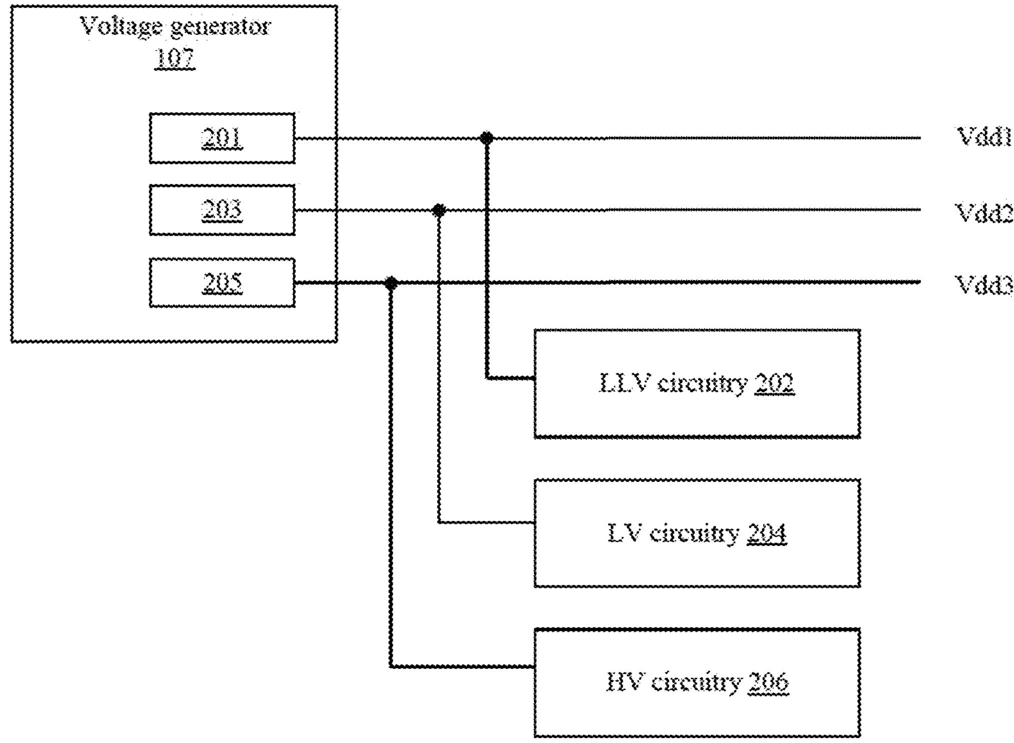
FIG. 2 illustrates an exemplary arrangement of multiple voltages and circuitry consistent with various disclosed embodiments in the present disclosure.
FIG. 3 illustrates a schematic diagram of peripheral circuits provided with various voltages arranged in separate semiconductor structures consistent with various disclosed embodiments in the present disclosure.

That is, the 3D memory device (e.g., 3D NAND flash memory device) may require a wide range of voltages to be supplied by the voltage generator and provided to different memory peripheral circuits. FIG. 2 illustrates an exemplary arrangement of multiple voltages and circuitry consistent with the disclosed embodiments. As shown in FIG. 2, the voltage generator 107 may include a low-low voltage (LLV) source 201, a low-voltage (LV) source 203, and a high-voltage (HV) source 205, each configured to provide a voltage at a respective level (Vdd1, Vdd2, or Vdd3). For example, Vdd3>Vdd2>Vdd 1. The LLV source 201 may be configured to provide a voltage below 2V, such as between 0.9V and 2V (e.g., 0.9V, 0.95V, 1V, 1.05V, 1.1V, 1.15V, 1.2V, 1.25V, 1.3V, 1.35V, 1.4V, 1.45V, 1.5V, 1.55V, 1.6V, 1.65V, 1.7V, 1.75V, 1.8V, 1.85V, 1.9V, 1.95V, any range bounded by any one of these values being the lower limit, or any range bounded by any two of these values). In one embodiment, the voltage is 1.2V.

Further, the LV source 203 may be configured to provide a voltage between 2V and 3.3V (e.g., 2V, 2.1V, 2.2V, 2.3V, 2.4V, 2.5V, 2.6V, 2.7V, 2.8V, 2.9V, 3V, 3.1V, 3.2V, 3.3V, any range bounded by any one of these values being the lower limit, or in any range bounded by any two of these values). In one embodiment, the voltage is 3.3V. The HV source 205 may be configured to provide a voltage greater than 3.3V, such as between 5V and 30V (e.g., 5V, 6V, 7V, 8V, 9V, 10V, 11V, 12V, 13V, 14V, 15V, 16V, 17V, 18V, 19V, 20V, 21V, 22V, 23V, 24V, 25V, 26V, 27V, 28V, 29V, 30V, any range bounded by any one of these values being the lower limit, or in any range bounded by any two of these values). It should be understood that the voltage ranges described above with respect to HV source 205, LV source 203, and LLV source 201 are for illustrative purposes and are not limiting, and that HV source 205, LV source 203, and LLV source 201 may provide any other suitable voltage ranges.

Further, based on the appropriate voltage levels (Vdd1, Vdd2, or Vdd3) of the memory peripheral circuitry (e.g., peripheral circuitry 103), the devices of the peripheral circuitry 103 may include LLV circuitry 202, LV circuitry 204, and HV circuitry 206, which may be coupled to the LLV source 201, LV source 203, and HV source 205, respectively. The LLV circuitry 202 and LV circuitry 204 may be referred as low voltage circuitry or lower voltage circuitry, and HV circuitry 206 may be referred as high voltage circuitry or higher voltage circuitry, which are operating at the LLV Vdd1, LV Vdd2, and HV Vdd3, respectively.

In some embodiments, the HV circuitry 206 includes one or more drive circuits coupled to the memory cell array by word lines, bit lines, and various gate lines, etc., and configured to drive the memory cell array by applying voltages at appropriate levels to the word lines, bit lines, and various gate lines, etc., when performing a memory operation (e.g., read, program, or erase). In one example, the HV circuitry 206 may include word line driver circuitry (e.g., in row decoder/word line driver 106) coupled to the word lines and applying a programming voltage (Vprog) or pass voltage (Vpass) in a range of, for example, 5V and 30V to the word lines during a programming operation. In another example, the HV circuitry 206 may include a bit line driver circuit (e.g., in the column decoder/bit line driver 105) coupled to the bit lines and applying an erase voltage (Veras) in a range of, for example, 5V and 30V to the bit lines during an erase operation.

The LV circuitry 204 may include the buffer circuitry of the page buffer 104 (e.g., in latches of page buffer 104) and may be configured to buffer data read from or programmed to the memory cell array in some implementations. For example, a voltage of, for example, 3.3V may be provided to the buffer of the page buffer 104 by the LV source 203. LV circuitry 204 may also include certain control logic circuitry (e.g., control logic). Further, the LLV circuitry 202 may include I/O circuitry configured to interface the memory cell array with a memory controller (not shown). For example, a voltage of, for example, 1.2V may be provided to the I/O circuit by LLV source 201.

In certain embodiments, to reduce the total area occupied by memory peripheral circuitry, peripheral circuitry 103 may be formed separately in different planes based on different performance requirements (e.g., applied voltages). For example, FIG. 3 illustrates a schematic diagram of peripheral circuits provided with various voltages arranged in separate semiconductor structures, consistent with disclosed embodiments. As shown in FIG. 3, the 3D memory device 100 may include three semiconductor structure planes (layers or wafers), a memory array semiconductor layer 310, a first CMOS semiconductor layer 320, and a second CMOS semiconductor layer 330. Other layers/planes may also be included. The semiconductor layer 310 may include the memory array 102. The semiconductor layer 320 may include the LLV circuitry 202 and the LV circuitry 204 of the peripheral circuitry. The semiconductor layer 330 may include the HV circuitry 206 of the peripheral circuitry.

That is, the lower voltage circuits (the LLV circuitry 202 and the LV circuitry 204) and the HV circuit 206 are separated, for example, in semiconductor structures 320 and 330, respectively, due to their significantly different voltages and the resulting different device dimensions, such as different substrate thicknesses and different gate dielectric thicknesses. In one example, the thickness of the semiconductor layer (e.g., substrate or thinned substrate) in which HV circuitry 206 is formed in semiconductor structure 330 may be greater than the thickness of the semiconductor layer (e.g., substrate or thinned substrate) in which LLV circuitry 202/LV circuitry 204 is formed in semiconductor structure 320. In another example, the thickness of the gate dielectric forming the transistors of HV circuitry 206 may be greater than the thickness of the gate dielectric forming the transistors of LLV circuitry 202/LV circuitry 204. For example, the difference in thickness may be at least 5 times. Although the semiconductor layers 320 and 330 are stacked together shown in FIG. 3, the semiconductor layers 320 and 330 may also be separated by semiconductor layer 310.

Figure 4:
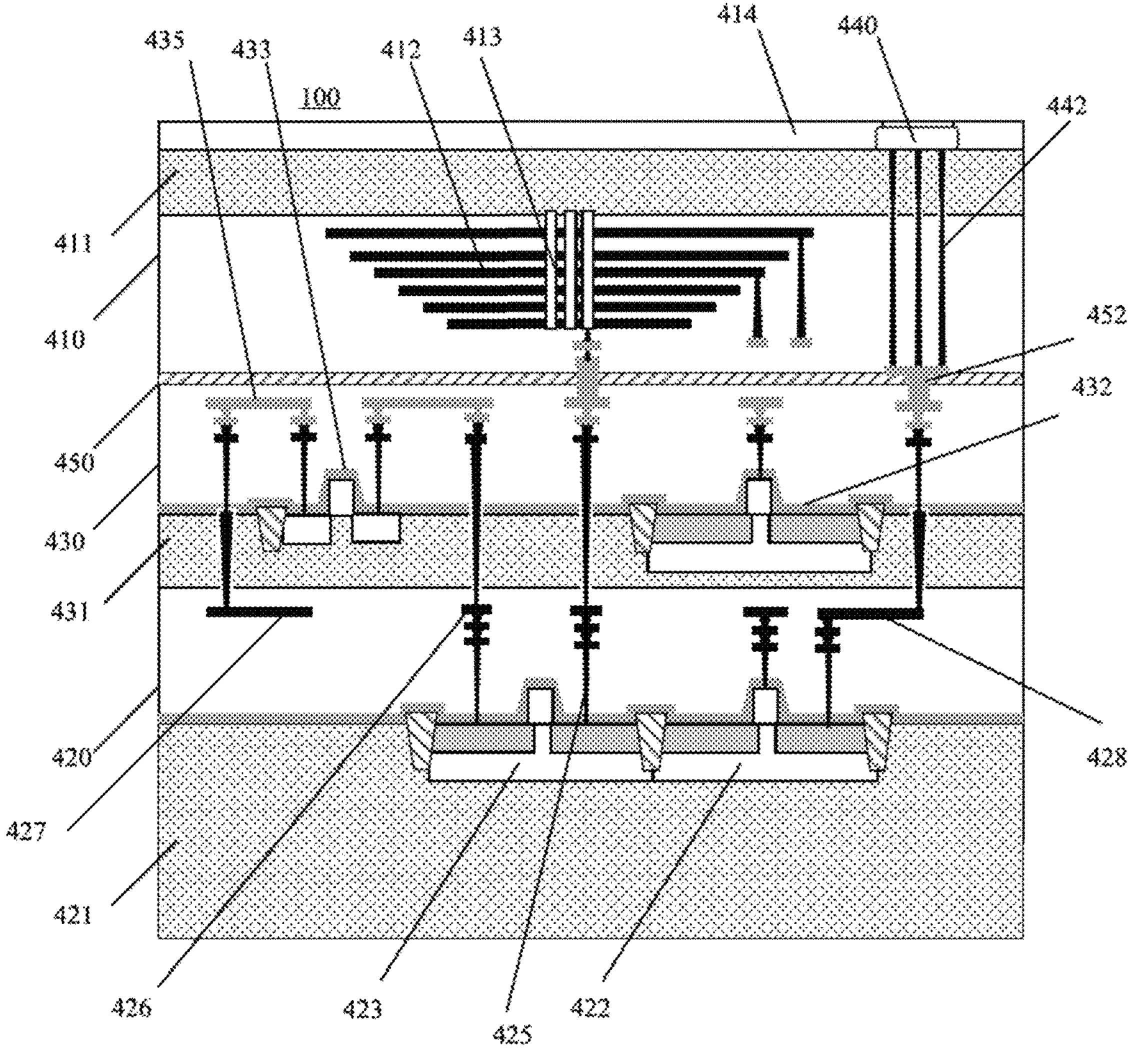
FIG. 4 illustrates an exemplary 3D memory device consistent with various disclosed embodiments in the present disclosure.

FIG. 4 illustrates an exemplary 3D memory device consistent with the disclosed embodiments of the present disclosure. As shown in FIG. 4, the 3D memory device (i.e., 3D NAND memory device) 100 may include a memory cell array wafer ("array wafer") 410, a first complementary metal-oxide-semiconductor wafer ("CMOS wafer") 420, and a second CMOS wafer 430. Other components may also be included. The memory array layer 410 corresponds to the memory array semiconductor layer 310, the first CMOS wafer 420 corresponds to the first CMOS semiconductor layer 320, and the second CMOS wafer 430 corresponds to the second CMOS semiconductor layer 330.

The array wafer 410 may include the memory structures for the 3D memory device 100, and the first CMOS wafer 420 and the second CMOS wafer 430 may include peripheral devices for the memory structures of the array wafer 410. The array wafer 410, the first CMOS wafer 420, and the second CMOS wafer 430 may be stacked together to form the framework of the 3D memory device 100. More specifically, the first CMOS wafer 420 may include high voltage circuits for the array wafer 410, while the second CMOS wafer 430 may include lower voltage circuits.

The array wafer 410 may include a substrate 411, a plurality of memory cells 412, and a string structure (SS) 413. Other structures and devices may also be included. The substrate 411 may be made of a material including silicon, germanium, SiGe, SiC, silicon on insulator (SOI), germanium on insulator (GOI), glass, III-V group compound (e.g., GaN, GaAs, InAs, etc.), or any other appropriate semiconductor material. In one embodiment, the substrate 411 is a silicon substrate.

In a 3D NAND memory device, the memory cells 412 may be formed as strings of memory cells, and the strings of memory cells 412 may form a plurality of memory blocks of the 3D NAND memory device. The plurality of memory blocks may be grouped into pages to form a 3D memory structure. For example, semiconductor pillars may be formed in the channel holes (CH) that vertically penetrate through a conductor-dielectric pair stack. The stair structure SS may be provided at the two opposite ends of each memory block for the formation of contacts such as through array contacts (TACs).

That is, in the 3D memory device 100, memory cells 412 for storing data are stacked vertically to form a stacked memory structure. The string structure 413 may be formed at one or more sides of the stacked memory structure for certain purposes, such as word line fan-out. The stacked memory structure may include a plurality of semiconductor channels, and the semiconductor channel can be vertical to the major surface of the substrate 411. In certain embodiments, the memory cells 412 and the string structure 413 may be formed at certain regions on the substrate 411/array wafer 410. For example, the substrate 411 may include one or more cell regions for forming the memory cells, and one or more string regions for forming the string structure. The one or more cell regions and the one or more string regions may be arranged in a predetermined way to increase efficient and/or reliability of the fabrication process of the array wafer 410.

For the 3D memory device 100, data is stored in the memory cells 412, which are formed in the cell regions of the array wafer 410. The memory cells 412 may formed as a plurality of memory blocks, and the plurality of memory blocks grouped into pages. Further, bit lines are also formed to connect the memory cells in the pages. The bit lines may also be formed in the cell region.

To support the memory cells, page buffers are included in the peripherical devices in the first CMOS wafer 420/the second CMOS wafer 430. Each page buffer may include circuits for supporting operations of the pages of the plurality of memory blocks. The circuits in the page buffers may be connected to the bit lines to form electrical connections. That is, a page buffer may be coupled to a bit line to perform certain operation on the memory element on the bit line. For example, the page buffer may be coupled to the bit line and a terminal of the voltage bias transistor. The page buffer may charge the bit line to a predetermined voltage according to a bit line bias voltage during a pre-charge operation, and may form a sensing path from the bit line to a sensing amplifier during a sense operation. Thus, the page buffer may include a plurality of devices to facilitate these operations, such as transistors, capacitors, and/or resisters, and metal connections among these devices, etc. These devices of the page buffer may include HV circuits (e.g., driver circuits), LV circuits, and/or LLV circuits, and these circuits of the page buffers may be formed in the first CMOS wafer 420 and the second CMOS wafer 430.

On the other hand, for the 3D memory device 100, the string structure is formed in the string structure region(s) SS 504 of the array wafer 410. The first CMOS wafer 420 may include circuits for the stringer driver (e.g., word line driver), as part of the HV circuitry 306, to support the string structure of the memory array in the array wafer 410.

Further, the array wafer 410 may include an insulating layer 414 formed on the back side of the substrate 411. The insulating layer 414 may have one or more openings for encapsulating and forming at least one array pad 440. The at least one array pad is in in contact with the least one through substrate contact (TSC) 442. The TSC 442 may be formed by conductor materials, such as W, Co, Cu, Al, polysilicon, silicides, or any combination thereof. In some embodiments, other conductor materials may be also used.

By using the at least one array pad 440 on the back side of the substrate 411, rather than the surrounding regions of the first substrate, other circuits including the periphery circuits of the 3D memory device 100 can be connected out through the back side of the 3D memory device 100. Thus, the size of the 3D memory device 100 can be reduced and the integration degree of the 3D memory device can be increased. Further, the risk of plasma-induced damage (PID) to the CMOS devices can also be eliminated.

Further, the first CMOS wafer 420 may include a substrate 421, a plurality of CMOS devices 422, and various interconnect structures 425, 426, 427, and 428. Other structures and devices may also be included. The substrate 421 may be made of a material including silicon, germanium, SiGe, SiC, silicon on insulator (SOI), germanium on insulator (GOI), glass, III-V group compound (e.g., GaN, GaAs, InAs, etc.), or any other appropriate semiconductor material. In one embodiment, the substrate 421 is a silicon substrate.

The CMOS devices 422 may refer generally to any appropriate peripheral devices for the array wafer 410 to support the memory arrays/cells and/or for the CMOS wafer 420. In certain embodiments, the peripheral devices 422 may include devices and circuits of the HV circuitry 206, such as digital signal circuits, analog signal circuits, and/or mixed signal circuits for HV circuitry 206, including various driver circuits, e.g., string driver circuits, bit line drivers of page buffers, or the like. The peripheral devices 422 may be formed in a number of regions on the substrate 421 comprising active and/or passive semiconductor components, such as transistors, diodes, capacitors, resistors, etc.

More specifically, the peripheral devices 422 include HV circuits 423 of the page buffers (e.g., bit line drivers), and a through silicon connect (TSC) 426 connecting the HV circuits 423 of the page buffers to other circuits of the page buffers in the second CMOS wafer 430. Further, TSC 425 may be provided to connect HV circuits of the string driver (e.g., word line drivers) to the string structure 413 in the array wafer 410. Interconnect 427 may be provided to connect devices or wirings in the first CMOS wafer 420 and the second CMOS wafer 430, and interconnect 428 may be provided to connect HV circuits in the first CMOS wafer 420 to the array pad 440 through the TSC 442.

Further, the second CMOS wafer 430 may include a substrate 431, a plurality of CMOS devices 432, and multiple interconnect structures 435. Other structures and devices may also be included. The substrate 431 may be made of a material including silicon, germanium, SiGe, SiC, silicon on insulator (SOI), germanium on insulator (GOI), glass, III-V group compound (e.g., GaN, GaAs, InAs, etc.), or any other appropriate semiconductor material. In one embodiment, the substrate 431 is a silicon substrate.

The CMOS devices 432 may refer generally to certain peripheral devices for the array wafer 410 to support the memory arrays/cells, the first CMOS wafer 420, and/or the second CMOS wafer 430. For example, the peripheral devices 432 may include the LLV circuitry 202 and LV circuitry 204 for the 3D memory device 100. Specifically, the CMOS devices 432 may include LV circuits 433 of the page buffers. The LLV circuits of the page buffers may also be included. That is, for the page buffers, the HV circuits may be included in the first CMOS wafer 420, while the LV circuits and/or LLV circuits may be included in the second CMOS wafer 430. The TSC 426 may connect the HV circuits in the first CMOS wafer 420 to the LV circuits/LLV circuits in the second CMOS wafer 430.

The array wafer 410 and the second CMOS wafer 430, which is bonded to the first CMOS wafer 420, may be bonded through the bonding interface 450. The bonding interface 450 may be a separate layer for bonding the array wafer 410 and the second CMOS wafer 430, or may be a joint surface between the bonded array wafer 410 and second CMOS wafer 430. For example, the bonding interface may include the interface between two dielectric layers (e.g., between a silicon nitride layer and a silicon oxide layer) and/or the interface between two conductive layers (e.g., between two metal layers). Further, one or more joint structures 452 may be formed at the bonding interface 450 to form electrical connections. For example, the joint structures 452 may be formed by corresponding one or more joint structures in the array wafer 410 and one or more joint structures in the second CMOS wafer 430 being made contacted with each other at the bonding interface 450 for electrical connections.

The bonding interface 450 may be formed in any appropriate process. For example, the bonding interface 450 may be formed by chemical bonds between the dielectric layers and/or the conductive layers on both sides of the bonding interface. For another example, the bonding interface 450 can be formed by physical interaction (e.g., inter-diffusion) between the dielectric layers and/or the conductive layers on both sides of the bonding interface. In some embodiments, the bonding interface can be formed after a plasma treatment or a thermal treatment of the surfaces from both sides of the bonding interface prior to the bonding process.

Because the array wafer 410 and the second CMOS wafer 430 are formed separately and then bonded together, damages from the various processes to form various layers and through silicon contacts (TSCs) may be performed on separate wafers without damaging each other's existing structures.

Further, the array wafer 410, the first CMOS wafer 420, and the second CMOS wafer 430 are stacked together to form the framework of the 3D memory device 100. In certain embodiments, when forming the first CMOS wafer 420 and the second CMOS wafer 430, under the memory cell structure of the array wafer 410, the peripheral devices in the first CMOS wafer 420 and the second CMOS wafer 430 may be formed in certain regions based on the device arrangement of the memory structure of the array wafer 410. Correspondingly, the peripheral circuitry 103 may be formed in a number of regions on the substrate 421 and on the substrate 431, and the regions for the peripheral circuitry 103 for the first CMOS wafer 420 and for the second CMOS wafer 430 may be determined according to the layout of the memory structure of the array wafer 410, as well as layouts of the first CMOS wafer 420 and the second CMOS wafer 430. That is, the peripheral devices on the first CMOS wafer 420 and the second CMOS wafer 430 are formed corresponding to the memory structure of the array wafer 410, such that the peripheral devices on the first CMOS wafer 420 and the second CMOS wafer 430 can support the function of the memory structure on the array wafer 410 (e.g., for power bus and metal routing). The peripheral devices on the first CMOS wafer 420 and the second CMOS wafer 430 are also arranged based on the layouts of the first CMOS wafer 420 and the second CMOS wafer 430 for effective interconnection, reliability, and easiness of bonding, etc. FIGS. 5A-5F illustrate certain arrangements of various regions among the array wafer 410, the first CMOS wafer 420, and the second CMOS wafer 430.

Figure 5A:
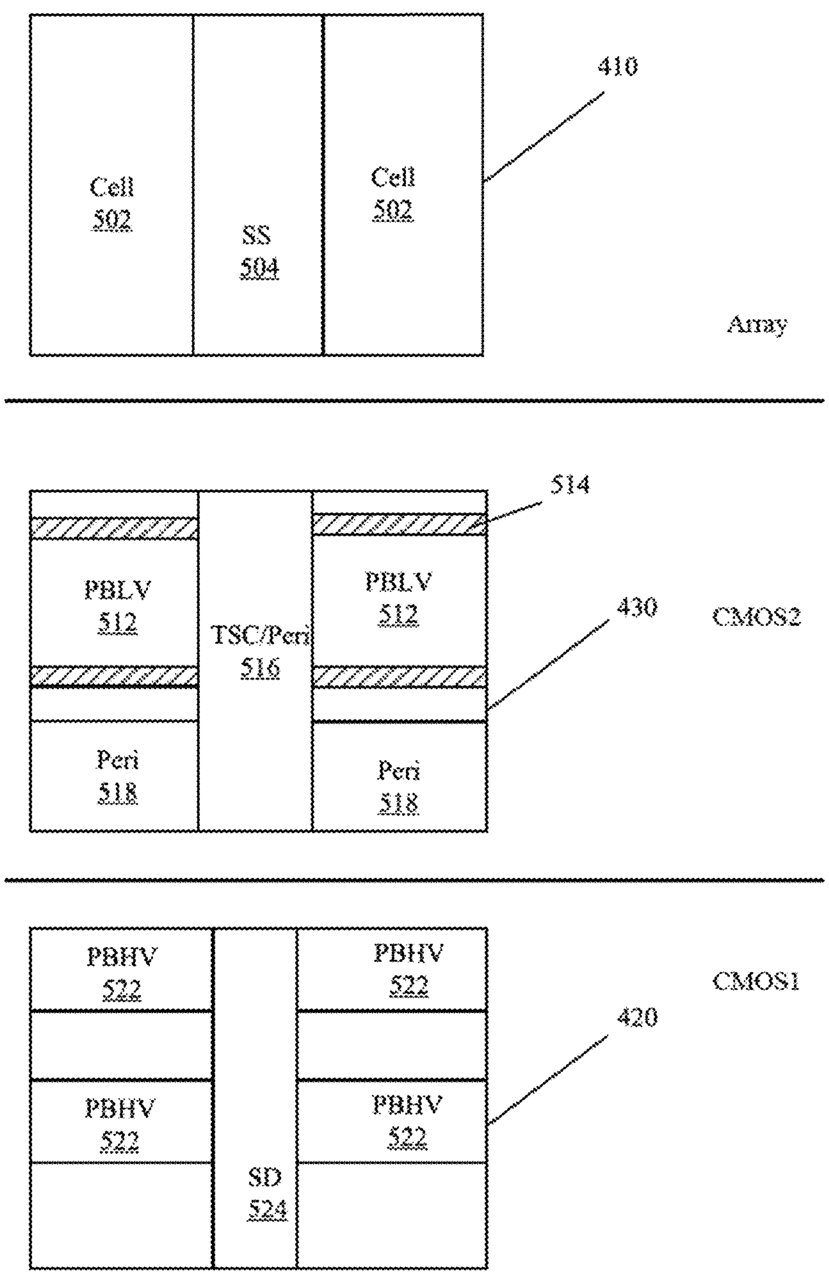
FIGS. 5A-5F illustrate certain arrangements of one or more cell regions and one or more string regions and corresponding CMOS regions consistent with various disclosed embodiments in the present disclosure.

Specifically, FIG. 5A illustrates an arrangement of one or more cell regions and one or more string regions and corresponding CMOS regions consistent with the disclosed embodiments. As shown in FIG. 5A, the array wafer 410 may include a string region SS 504 at the center portion of the array wafer 410, and two cell regions Cell 502 at each side of the array wafer 410.

As shown in FIG. 5A, horizontally or laterally, the first CMOS wafer 420 may include a string driver region SD 524 at the center of the first CMOS wafer 420 to form string driver circuits and certain decoders, corresponding to the string structure region SS 504 of the array wafer 410. The first CMOS wafer 420 may also include four page buffer HV circuit regions PBHV 522, two on each side of the first CMOS wafer 420. The remaining regions may form the other high voltage devices of the HV circuitry 306.

As shown in FIG. 5A, horizontally or laterally, the second CMOS wafer 430 may include two page buffer regions PBLV 512 at each side of the second CMOS wafer 430, corresponding to the cell regions Cell 502 of the array wafer 410, to form LV circuits and/or LLV circuits of the page buffers. The second CMOS wafer 430 may also include two peripheral regions Peri 518 to form certain other lower voltage peripheral devices on the second CMOS wafer 430, including the LV circuitry 204 and the LLV circuitry 202. Further, each page buffer region PBLV 512 may include two interconnects regions TSC 514 at both ends, and each TSC 514 may be corresponding to or directly under the region PBHV 522 for forming TSCs to connect the HV circuits in the PBHV 522 with LV circuits and/or other circuits of the page buffers in the PBLV 512.

The second CMOS wafer 430 may also include an interconnect and peripheral region TSC/Peri 516 to form through silicon connects for connecting peripheral devices in the first CMOS wafer 420 and the second CMOS wafer 430, such as connecting the HV circuits of the string driver in the first CMOS wafer 420 to the string structure in the array wafer 410. Other peripheral devices may also be formed in the TSC/Peri 516. In one embodiment, the string driver region SD 524 is under the region SS 504, with a smaller width, and the page buffer regions PBLV 512 and PBHV 522 are under the cell regions Cell 502. Other regions may also be used.

Figure 5B:
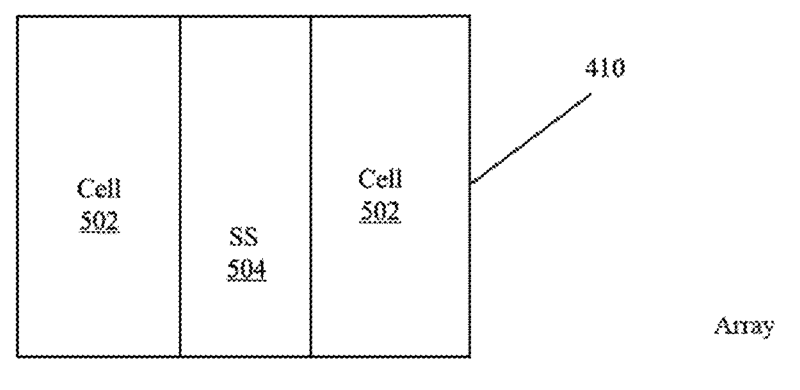
Figure 5B:
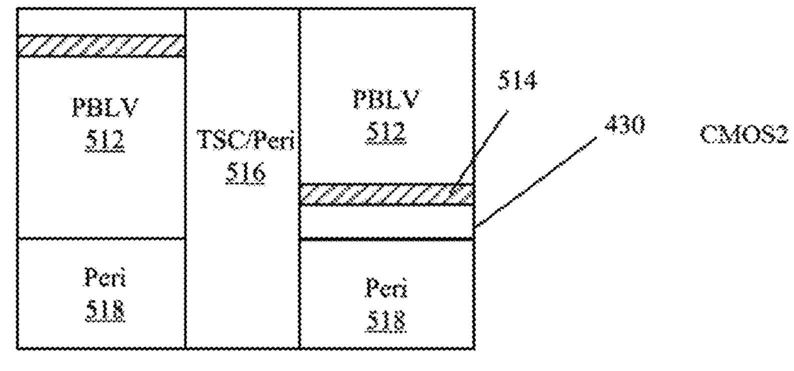
Figure 5B:
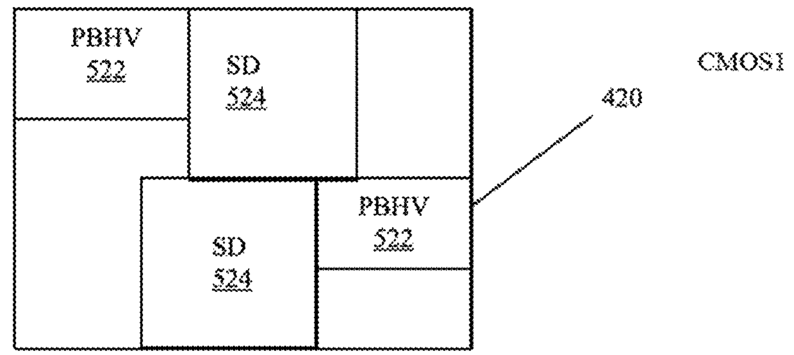

FIG. 5B illustrates another arrangement of the one or more cell regions and the one or more string regions and corresponding CMOS regions consistent with the disclosed embodiments. As shown in FIG. 5B, the array wafer 410 may include a string region SS 504 at the center of the array wafer 410, and two cell regions Cell 502 at each side of the array wafer 410.

As shown in FIG. 5B, horizontally or laterally, the first CMOS wafer 420 may include two string driver regions SD 524 at the center portion of the first CMOS wafer 420 to form string driver circuits and certain decoders, corresponding to the string structure region SS 504 of the array wafer 410. The two regions SD 524 may be staggered with each other and overlapped at the center of the first CMOS wafer 420, corresponding to the SS 504 in the array wafer 410. The first CMOS wafer 420 may also include two page buffer HV circuit regions PBHV 522 on each side of the first CMOS wafer 420, each neighboring the SD 524. The remaining regions may form the other high voltage devices of the HV circuitry 306.

As shown in FIG. 5B, horizontally or laterally, the second CMOS wafer 430 may include two page buffer regions PBLV 512 at each side of the second CMOS wafer 430, corresponding to the cell regions Cell 502 of the array wafer 410, to form LV circuits and/or LLV circuits of the page buffers. The second CMOS wafer 430 may also include two peripheral regions Peri 518 to form certain other lower voltage peripheral devices on the second CMOS wafer 430, including the LV circuitry 204 and the LLV circuitry 202. In one embodiment, each PBLV 512 is at the upper end of the side portion, and each Peri 518 is at the lower end of the side portion. Further, each page buffer region PBLV 512 may include one TSC 514 at one end, and the TSC 514 may correspond to the region PBHV 522 to connect the HV circuits in the PBHV 522 with other circuits of the page buffers in the PBLV 512.

The second CMOS wafer 430 may also include an interconnect and peripheral region TSC/Peri 516 at the center portion to form through silicon connects for connecting peripheral devices in the first CMOS wafer 420 and the second CMOS wafer 430, such as the HV circuits of the string driver in the first CMOS wafer 420. Other peripheral devices may also be formed in the TSC/Peri 516. In one embodiment, the string driver regions SD 524 are substantially under the region SS 504, with a bigger width, and the page buffer regions PBLV 512 and PBHV 522 are under the cell regions Cell 502. In other words, horizontally, the width of the region SD 524 is bigger than the width of the region SS 504. Further, in the horizontal direction, the region SD 524 can expand in the horizontal direction to cover a substantial horizontal range or all horizontal range, and the region SD 524 may also overlap with the region PBHV 522 at the horizontal direction. The region PBHV 522 may also cover the cell region in the horizontal direction. In the vertical direction, the region SD 524 may also cover the entire vertical range. Other regions may also be used. Similar parameters, special relationships, and configuration may also used.

Figure 5C:
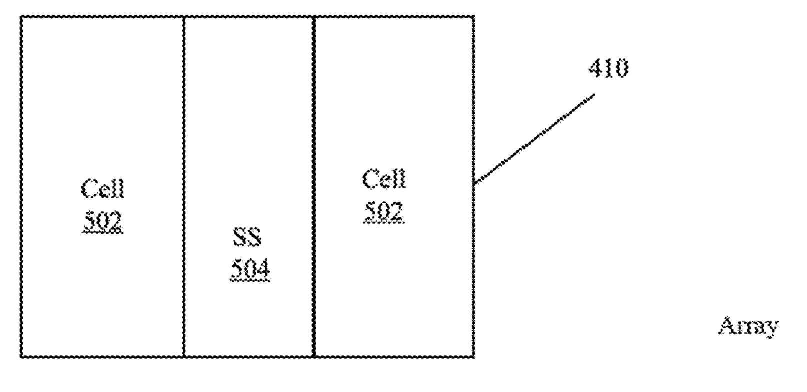
Figure 5C:
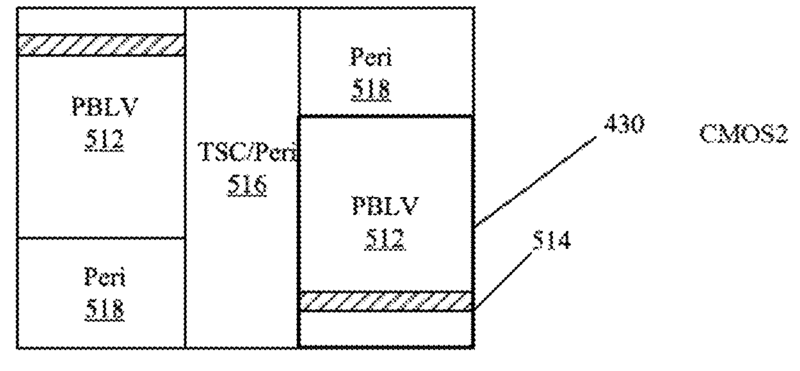
Figure 5C:
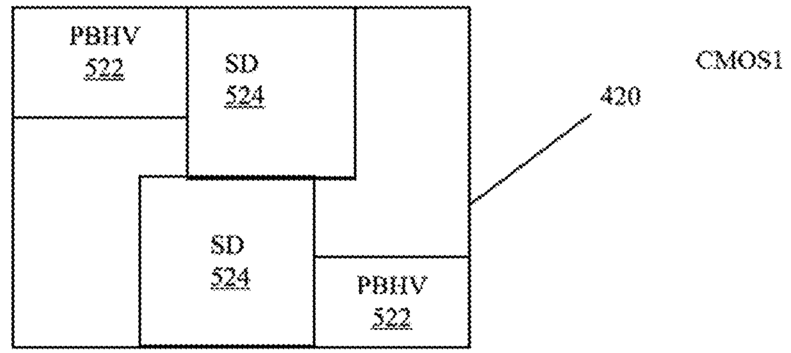

FIG. 5C illustrates another arrangement of the one or more cell regions and the one or more string regions and corresponding CMOS regions consistent with the disclosed embodiments. As shown in FIG. 5C, the array wafer 410 may include a string region SS 504 at the center of the array wafer 410, and two cell regions Cell 502 at each side of the array wafer 410.

As shown in FIG. 5C, horizontally or laterally, the first CMOS wafer 420 may include two string driver regions SD 524 at the center portion of the first CMOS wafer 420 to form string driver circuits and certain decoders, corresponding to the string structure region SS 504 of the array wafer 410. The two regions SD 524 may be staggered with each other and overlapped at the center of the first CMOS wafer 420, corresponding to the SS 504 in the array wafer 410. The first CMOS wafer 420 may also include two page buffer HV circuit regions PBHV 522 on each side of the first CMOS wafer 420, each neighboring the SD 524. In one embodiment, one PBHV 522 is at the upper end of the side portion, and the other PBHV 522 is at the lower end of the side portion. The remaining regions may form the other high voltage devices of the HV circuitry 306.

As shown in FIG. 5C, horizontally or laterally, the second CMOS wafer 430 may include two page buffer regions PBLV 512 at each side of the second CMOS wafer 430, corresponding to the cell regions Cell 502 of the array wafer 410, to form LV circuits and/or LLV circuits of the page buffers. The second CMOS wafer 430 may also include two peripheral regions Peri 518 to form certain other lower voltage peripheral devices on the second CMOS wafer 430, including the LV circuitry 204 and the LLV circuitry 202. In one embodiment, one PBLV 512 is at the upper end of the side portion, and another PBLV 512 is at the lower end of the side portion. Accordingly, one Peri 518 is at the lower end of the side portion, another Peri 518 is at the upper end of the side portion. Further, each page buffer region PBLV 512 may include one TSC 514 at one end, and the TSC 514 may correspond to the region PBHV 522 to connect the HV circuits in the PBHV 522 with other circuits of the page buffers in the PBLV 512.

The second CMOS wafer 430 may also include an interconnect and peripheral region TSC/Peri 516 at the center portion to form through silicon connects for connecting peripheral devices in the first CMOS wafer 420 and the second CMOS wafer 430, such as the HV circuits of the string driver in the first CMOS wafer 420. Other peripheral devices may also be formed in the TSC/Peri 516. In one embodiment, the string driver regions SD 524 are substantially under the region SS 504, with a bigger width, and the page buffer regions PBLV 512 and PBHV 522 are under the cell regions Cell 502. In other words, horizontally, the width of the region SD 524 is bigger than the width of the region SS 504. Other regions may also be used.

Figure 5D:
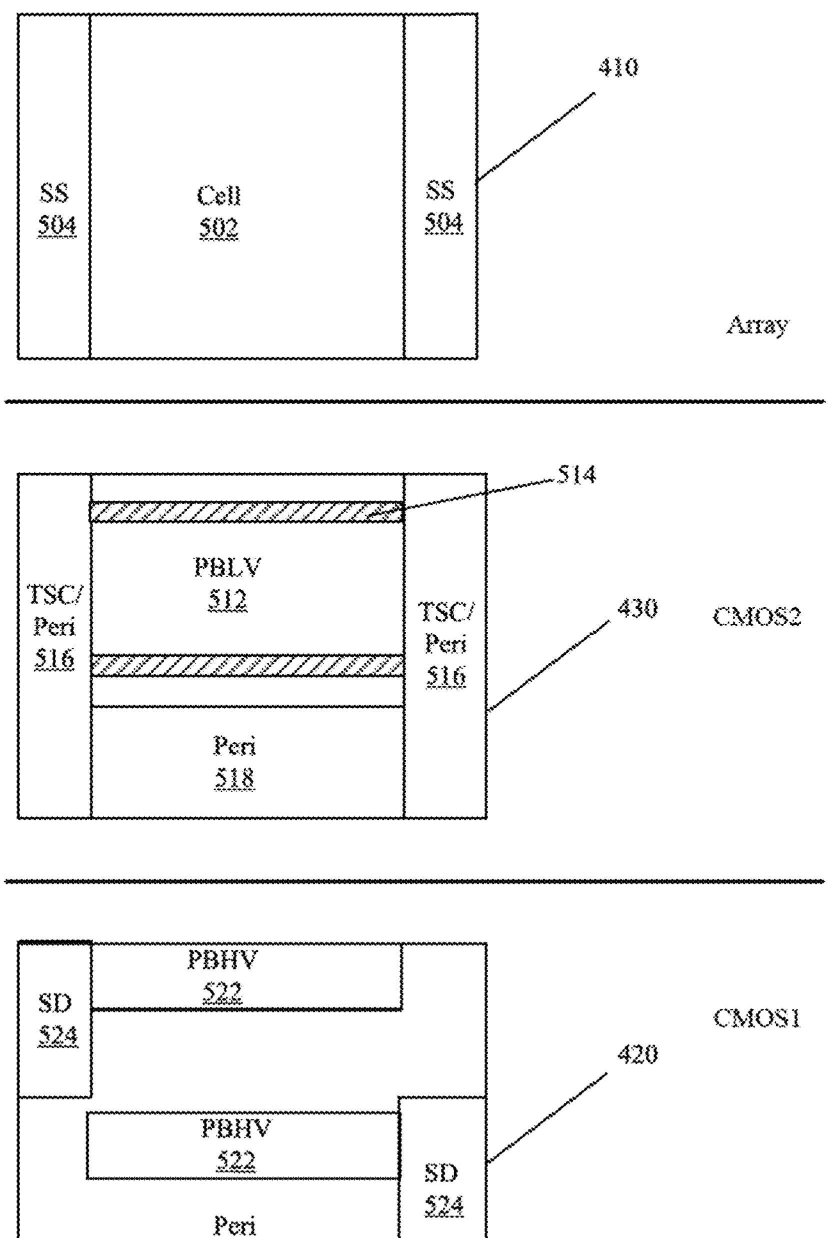

FIG. 5D illustrates another arrangement of the one or more cell regions and the one or more string regions and corresponding CMOS regions consistent with the disclosed embodiments. As shown in FIG. 5D, the array wafer 410 may include a cell region Cell 502 at the center of the array wafer 410, and two SS regions 504 at each side of the array wafer 410. Other layouts may also be used.

As shown in FIG. 5D, horizontally or laterally, the first CMOS wafer 420 may include two string driver regions SD 524 at each side of the second CMOS wafer 430 (e.g., the upper left corner region and the lower right corner region), corresponding to the string structure regions SS 504 of the array wafer 410. The first CMOS wafer 420 may also include two page buffer HV circuit regions PBHV 522 at the center portion of the first CMOS wafer 420, and one PBHV 522 is at the upper end of the center portion, and the other PBHV 522 is at the middle of the center portion, each neighboring the SD 524. The remaining regions may be referred to as peripheral device region Peri 528 including the lower center portion and may form the other high voltage devices of the HV circuitry 306.

As shown in FIG. 5D, horizontally or laterally, the second CMOS wafer 430 may include a page buffer region PBLV 512 at the center portion of the second CMOS wafer 430 to form LV circuits and/or LLV circuits of the page buffers, corresponding to the cell region Cell 502 of the array wafer 410. Further, the page buffer region PBLV 512 may include two TSC 514 at upper and lower ends of the PBLV 512, and the TSC 514 may correspond to the region PBHV 522 to connect the HV circuits in the PBHV 522 with other circuits of the page buffers in the PBLV 512.

The second CMOS wafer 430 may also include two interconnect and peripheral regions TSC/Peri 516 at each side of the second CMOS wafer 430 to form through silicon connects for connecting peripheral devices in the first CMOS wafer 420 and the second CMOS wafer 430, such as the HV circuits of the string driver in the first CMOS wafer 420. Other peripheral devices may also be formed in the TSC/Peri 516. The CMOS wafer 430 may also include a peripheral region Peri 518 at the lower center portion of the first CMOS wafer 420 to form certain other lower voltage peripheral devices on the CMOS wafer 430, including the LV circuitry 204 and the LLV circuitry 202.

In one embodiment, the string driver regions SD 524 are under the regions SS 504, with a smaller width, and the page buffer region PBLV 512 and PBHV 522 are under the cell region Cell 502. Other regions may also be used.

Figure 5E:
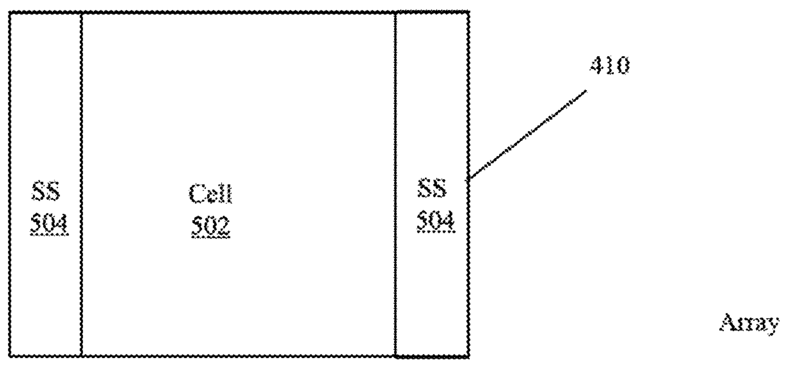
Figure 5E:
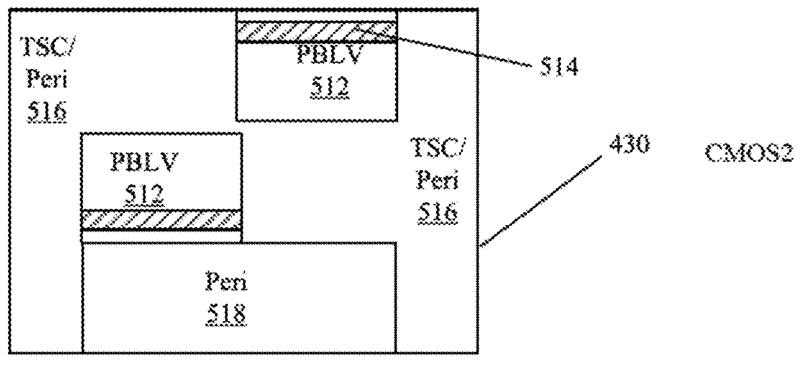
Figure 5E:
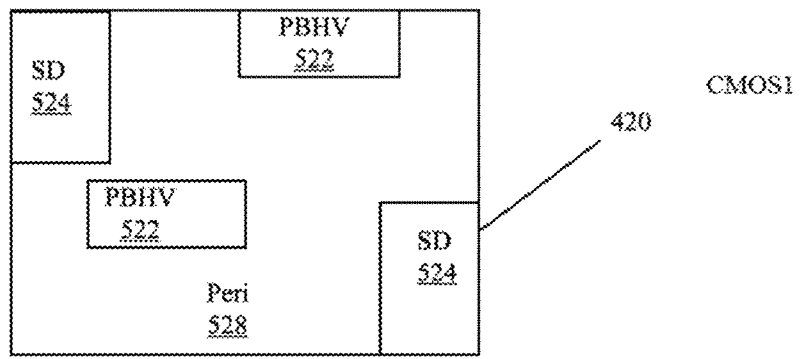

FIG. 5E illustrates another arrangement of the one or more cell regions and the one or more string regions and corresponding CMOS regions consistent with the disclosed embodiments. As shown in FIG. 5E, the array wafer 410 may include a cell region Cell 502 at the center of the array wafer 410, and two SS regions 504 at each side of the array wafer 410. Other layouts may also be used.

As shown in FIG. 5E, horizontally or laterally, the first CMOS wafer 420 may include two string driver regions SD 524 at each side of the second CMOS wafer 430 (e.g., the upper left corner region and the lower right corner region), corresponding to the string structure regions SS 504 of the array wafer 410. The first CMOS wafer 420 may also include two page buffer HV circuit regions PBHV 522 at the center portion of the first CMOS wafer 420, and one PBHV 522 is at the upper right end of the center portion, and the other PBHV 522 is at the middle left of the center portion. The remaining regions may be referred to as peripheral device region Peri 528 including the lower center portion and may form the other high voltage devices of the HV circuitry 306.

As shown in FIG. 5E, horizontally or laterally, the second CMOS wafer 430 may include two page buffer regions PBLV 512 at the center portion of the second CMOS wafer 430 to form LV circuits and/or LLV circuits of the page buffers, corresponding to the cell region Cell 502 of the array wafer 410. One PBHV 522 is at the upper right end of the center portion, and the other PBHV 522 is at the middle left of the center portion Further, each page buffer region PBLV 512 may include one TSC 514, one at the upper end of the PBLV 512 and the other at the lower end of the PBLV 512, and the TSC 514 may correspond to the region PBHV 522 to connect the HV circuits in the PBHV 522 with other circuits of the page buffers in the PBLV 512.

The second CMOS wafer 430 may also include two interconnect and peripheral regions TSC/Peri 516 at each side of the second CMOS wafer 430 to form through silicon connects for connecting peripheral devices in the first CMOS wafer 420 and the second CMOS wafer 430, such as the HV circuits of the string driver in the first CMOS wafer 420. Other peripheral devices may also be formed in the TSC/Peri 516. The CMOS wafer 430 may also include a peripheral region Peri 518 at the lower center portion of the first CMOS wafer 420 to form certain other lower voltage peripheral devices on the CMOS wafer 430, including the LV circuitry 204 and the LLV circuitry 202.

In one embodiment, the string driver regions SD 524 are under the regions SS 504, which may be wider than the SS 504, and the page buffer region PBLV 512 and PBHV 522 are under the cell region Cell 502, with smaller dimensions. Other regions may also be used.

Figure 5F:
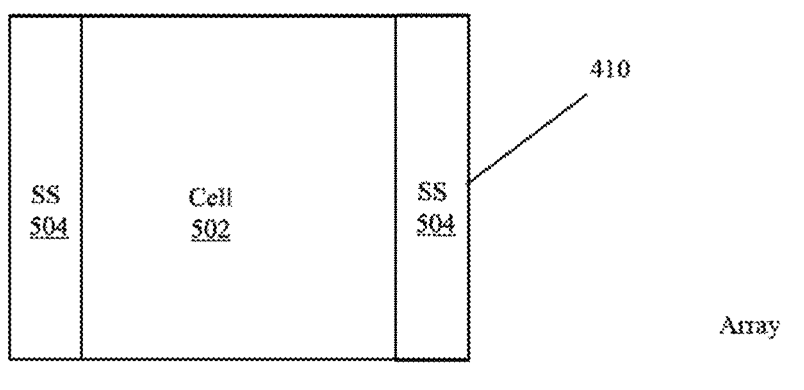
Figure 5F:
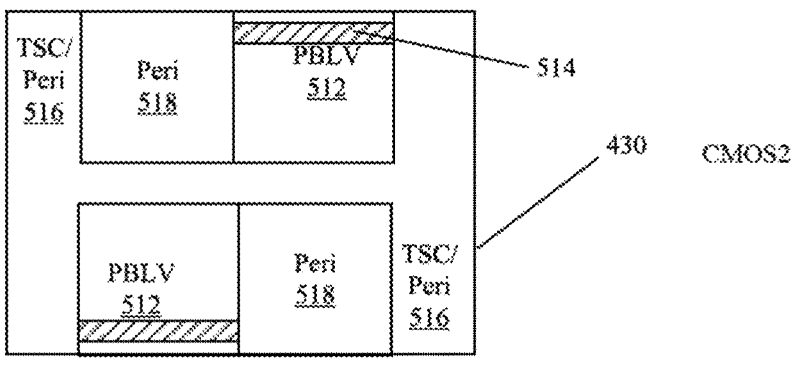
Figure 5F:
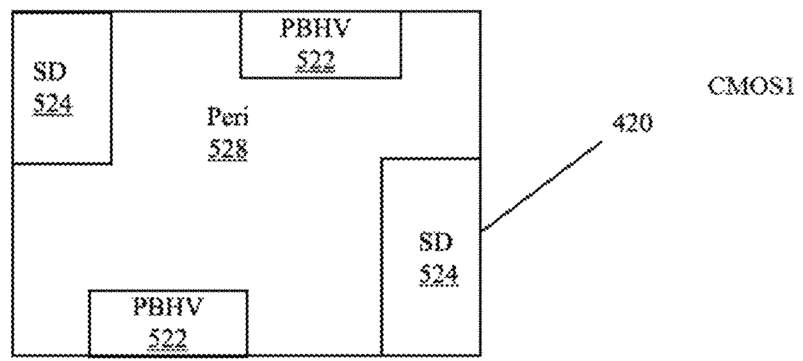

FIG. 5F illustrates another arrangement of the one or more cell regions and the one or more string regions and corresponding CMOS regions consistent with the disclosed embodiments. As shown in FIG. 5F, the array wafer 410 may include a cell region Cell 502 at the center of the array wafer 410, and two SS regions 504 at each side of the array wafer 410. Other layouts may also be used.

As shown in FIG. 5F, horizontally or laterally, the first CMOS wafer 420 may include two string driver regions SD 524 at each side of the second CMOS wafer 430 (e.g., the upper left corner region and the lower right corner region), corresponding to the string structure regions SS 504 of the array wafer 410. The first CMOS wafer 420 may also include two page buffer HV circuit regions PBHV 522 at the center portion of the first CMOS wafer 420, and one PBHV 522 is at the upper right end of the center portion, and the other PBHV 522 is at the lower left end of the center portion. The remaining regions may be referred to as peripheral device region Peri 528 including the lower center portion and may form the other high voltage devices of the HV circuitry 306.

As shown in FIG. 5F, horizontally or laterally, the second CMOS wafer 430 may include two page buffer regions PBLV 512 at the center portion of the second CMOS wafer 430 to form LV circuits and/or LLV circuits of the page buffers, corresponding to the cell region Cell 502 of the array wafer 410. One PBLV 512 is at the upper right end of the center portion, and the other PBLV 512 is at the lower left end of the center portion. Further, each page buffer region PBLV 512 may include one TSC 514, the TSC 514 of the PBLV 512 at the upper right end may be at the upper end of the PBLV 512, and the TSC 514 of the PBLV 512 at the lower left end may be at the lower end of the PBLV 512. Each TSC 514 may correspond to the region PBHV 522 to connect the HV circuits in the PBHV 522 with other circuits of the page buffers in the PBLV 512.

The second CMOS wafer 430 may also include two interconnect and peripheral regions TSC/Peri 516 at each side of the second CMOS wafer 430 to form through silicon connects for connecting peripheral devices in the first CMOS wafer 420 and the second CMOS wafer 430, such as the HV circuits of the string driver in the first CMOS wafer 420. Other peripheral devices may also be formed in the TSC/Peri 516. The CMOS wafer 430 may also include two peripheral regions Peri 518 at the upper left end of the center portion and the lower right end of the center portion to form certain other lower voltage peripheral devices on the CMOS wafer 430, including the LV circuitry 204 and the LLV circuitry 202.

In one embodiment, the string driver regions SD 524 are under the regions SS 504, which may be wider than the SS 504, and the page buffer region PBLV 512 and PBHV 522 are under the cell region Cell 502, with smaller dimensions. Other regions may also be used.

Figure 6:
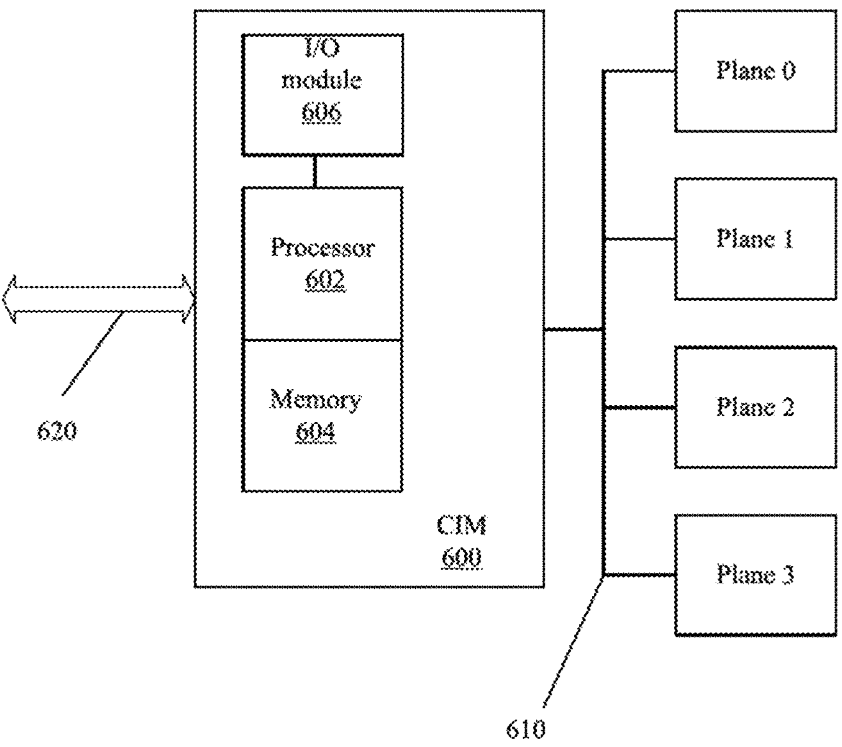
FIG. 6 illustrates a block diagram of a controller in memory (CIM) structure consistent with the disclosed embodiments of the present disclosure.

By including two CMOS wafers, the first CMOS wafer 420 and the second CMOS wafer 430, there may be spare spaces to be further utilized. In certain embodiments, a controller in memory (CIM) structure may be included in one CMOS wafer or both CMOS wafers. The CIM structure may include a controller, a memory (i.e., static random memory or SRAM), and other circuits to implement a memory controller circuit for controlling the operation of the 3D memory device 100. In certain embodiments, the CIM structure may be included in the second CMOS wafer 530, e.g., the control and logic circuits of the CIM to provide control functions for the 3D memory device 100. FIG. 6 illustrates a block diagram of a CIM structure consistent with the disclosed embodiments of the present disclosure.

As shown in FIG. 6, the CIM structure 600 includes a processor 602, a memory 604, and an input/output module 606. Other devices may also be included. The processor 602 may include any appropriate circuits to implement control functionalities of the CIM structure 600. The memory 604 may include memory modules coupled to the processor 602 to store information for the processor 602 to function. The input/output module 606 may be coupled to the processor to perform various bus operations. Further, the CIM structure may include an internal interface 610 to manage various memory planes in the 3D memory device 100, e.g., memory plane 0, memory plane 1, memory plane 2, memory plane 3, etc. The CIM structure may also include a host interface 620 to interact with an external host to access to the memory planes in the 3D memory device 100.

The CIM structure may be implemented based on certain layout arrangements as previously described. For the convenience of illustration, the region for forming the CIM structure is referred to as an SRAM region. FIGS. 7A-7F illustrate certain arrangements of various regions among the array wafer 410, the first CMOS wafer 420, and the second CMOS wafer 430 with the addition of the SRAM (i.e., CIM structure), corresponding to FIGS. 5A-5F.

Figure 7A:
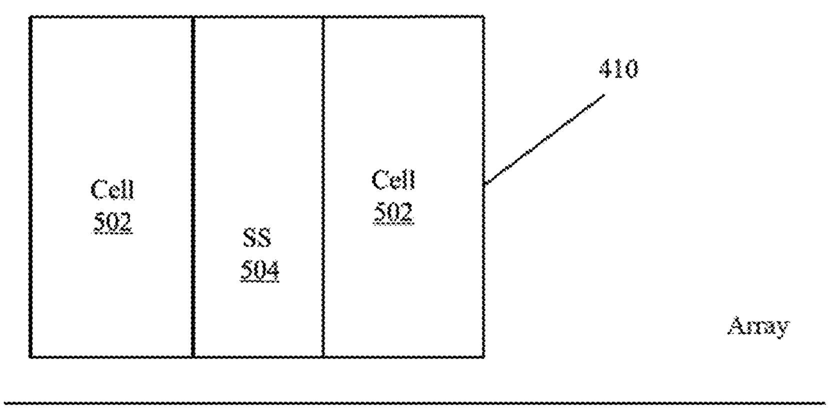
FIGS. 7A-7F illustrate certain other arrangements of one or more cell regions and one or more string regions and corresponding CMOS regions consistent with various disclosed embodiments in the present disclosure.
Figure 7A:
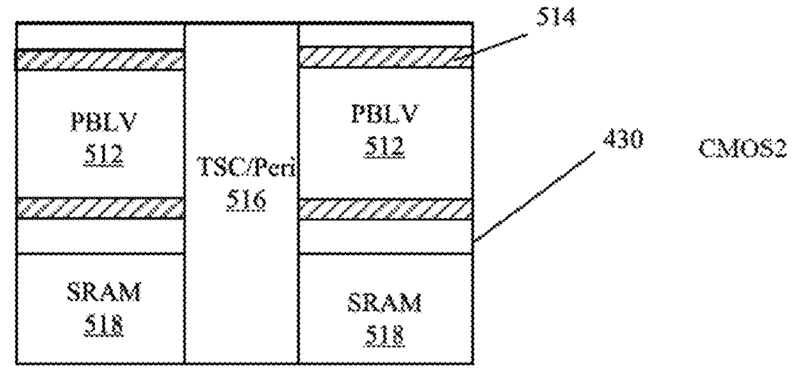
Figure 7A:
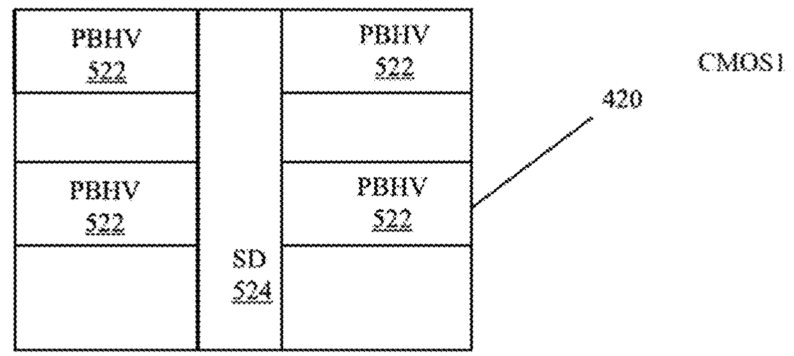

As shown in FIG. 7A, and also referring to FIG. 5A, in the second CMOS wafer 430, two CIM regions SRAM 518 replace the two peripheral regions Peri 518. Other layouts may be the same in FIG. 7A and in FIG. 5A.

Figure 7B:
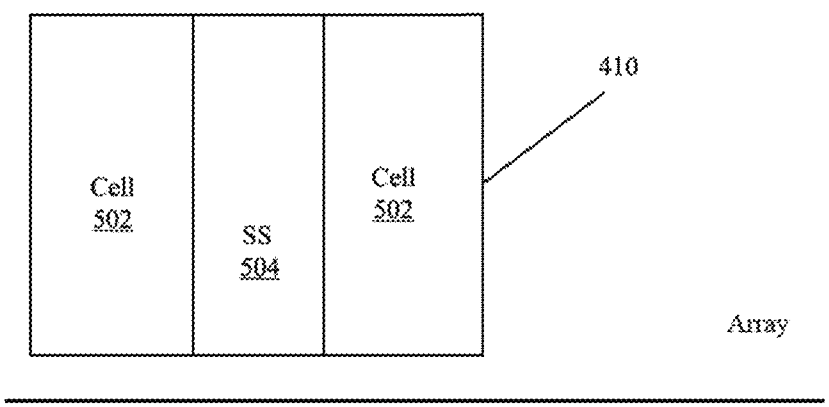
Figure 7B:
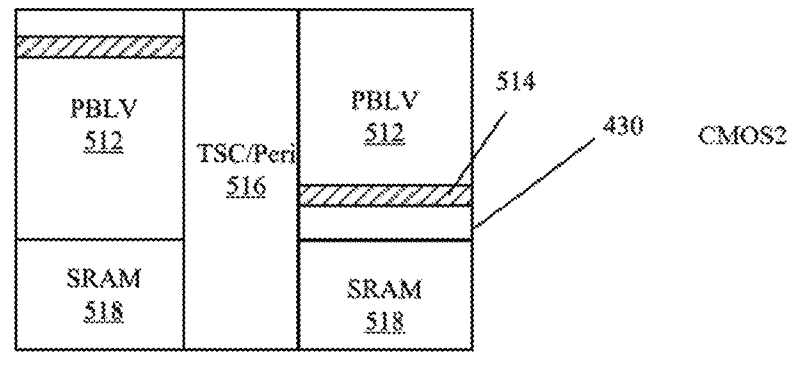
Figure 7B:
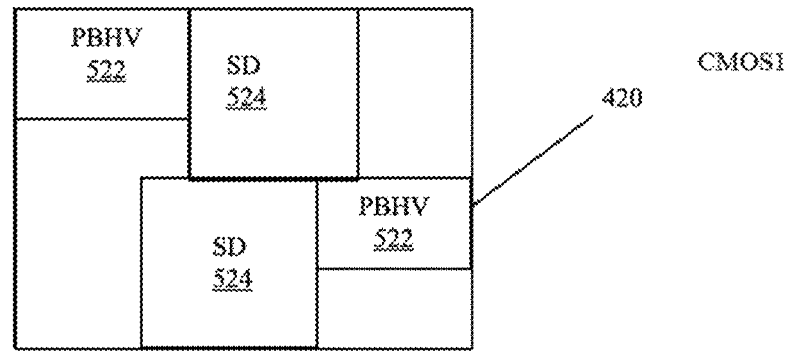

As shown in FIG. 7B, and also referring to FIG. 5B, in the second CMOS wafer 430, two CIM regions SRAM 518 replace the two peripheral regions Peri 518. Other layouts may be the same in FIG. 7B and in FIG. 5B.

Figure 7C:
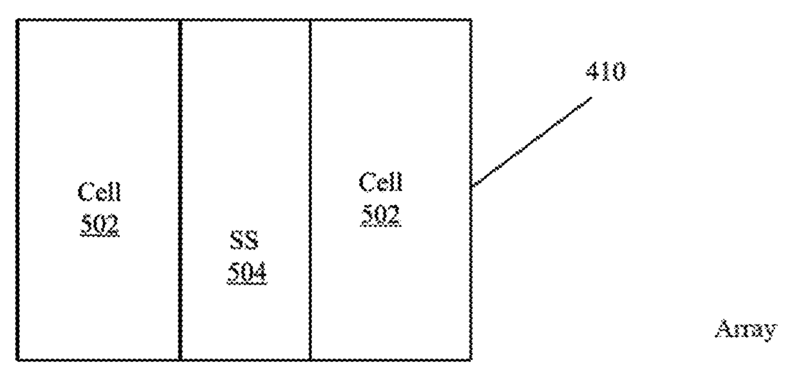
Figure 7C:
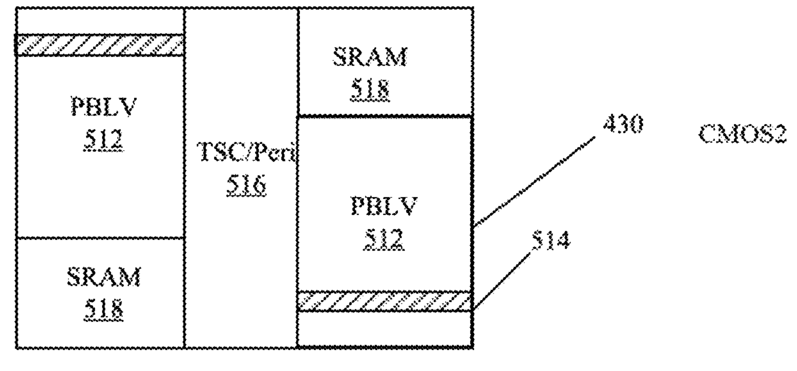
Figure 7C:
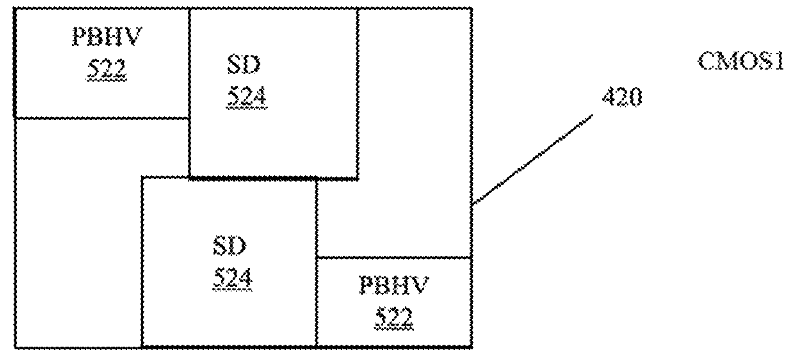

As shown in FIG. 7C, and also referring to FIG. 5C, in the second CMOS wafer 430, two CIM regions SRAM 518 replace the two peripheral regions Peri 518. Other layouts may be the same in FIG. 7C and in FIG. 5C.

Figure 7D:
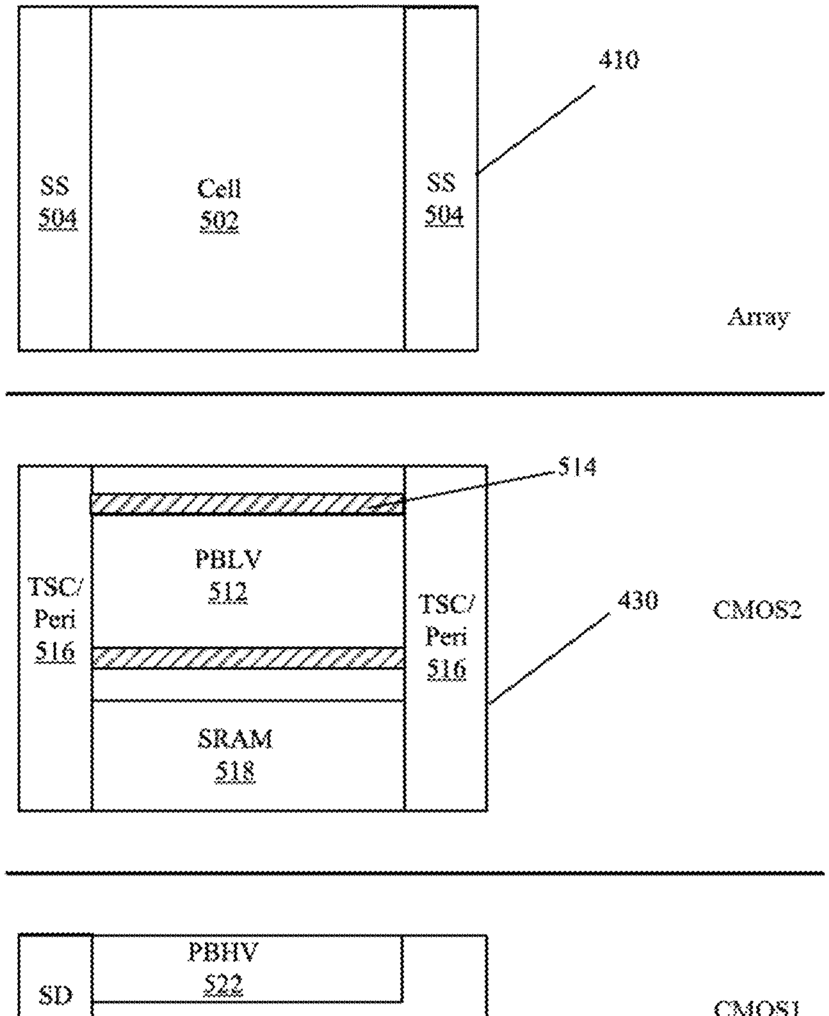

As shown in FIG. 7D, and also referring to FIG. 5D, in the second CMOS wafer 430, one CIM region SRAM 518 replaces the one peripheral region Peri 518. Other layouts may be the same in FIG. 7D and in FIG. 5D.

Figure 7E:
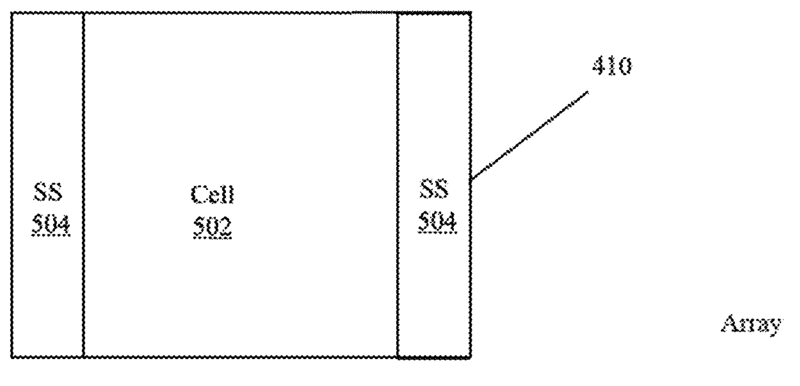
Figure 7E:
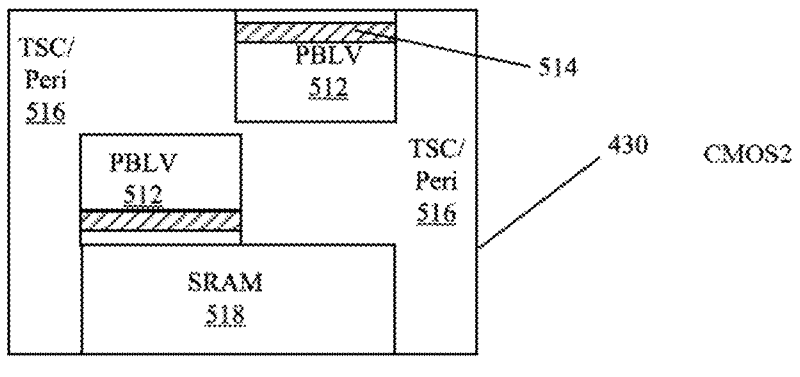
Figure 7E:
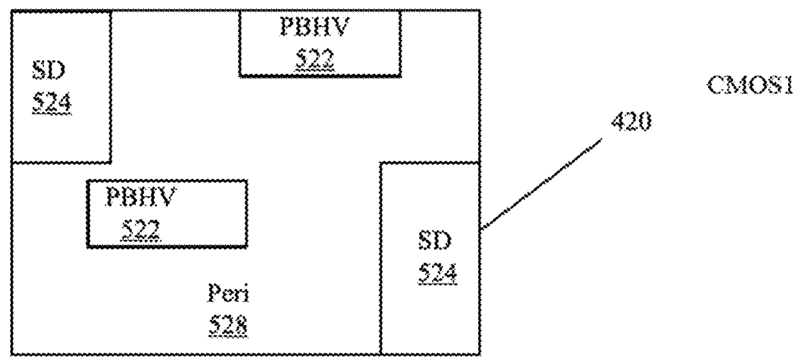

As shown in FIG. 7E, and also referring to FIG. 5E, in the second CMOS wafer 430, one CIM region SRAM 518 replaces the one peripheral region Peri 518. Other layouts may be the same in FIG. 7E and in FIG. 5E.

Figure 7F:
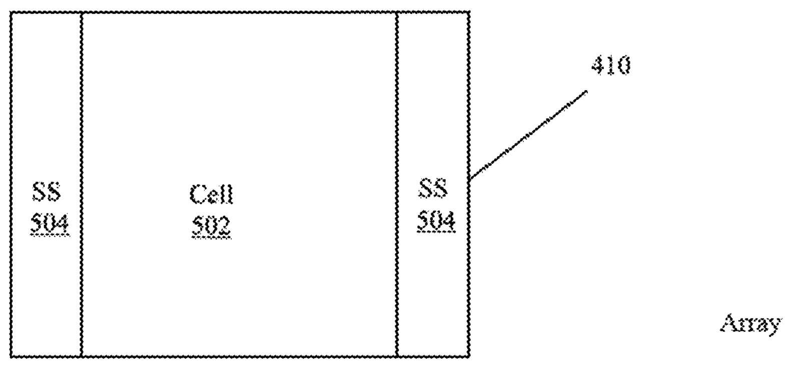
Figure 7F:
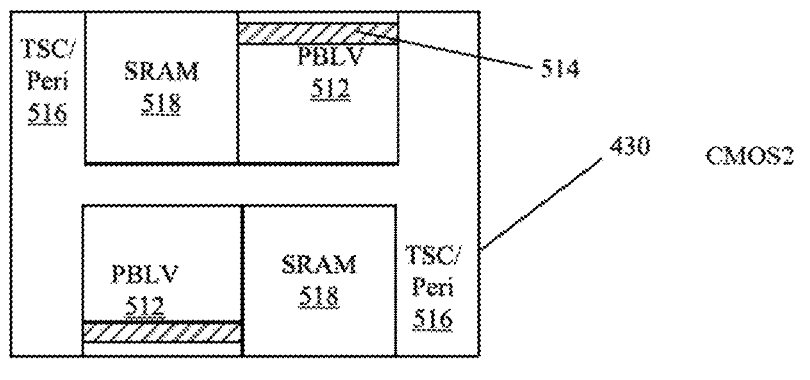
Figure 7F:
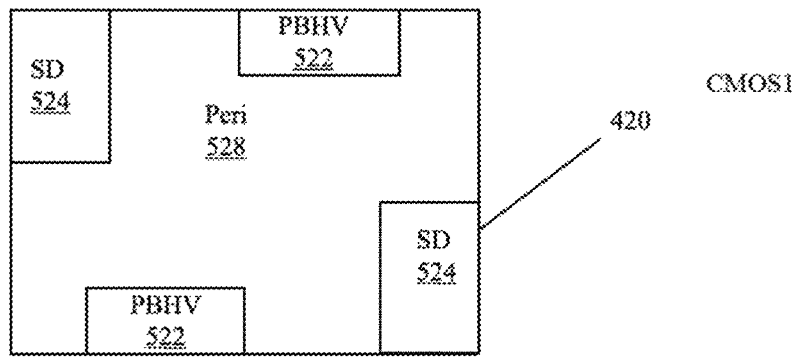

As shown in FIG. 7F, and also referring to FIG. 5F, in the second CMOS wafer 430, two CIM regions SRAM 518 replace the two peripheral regions Peri 518. Other layouts may be the same in FIG. 7F and in FIG. 5F.

Figure 8:
FIG. 8 illustrates an exemplary fabrication process of a 3D memory device consistent with various disclosed embodiments in the present disclosure.
Figure 8:
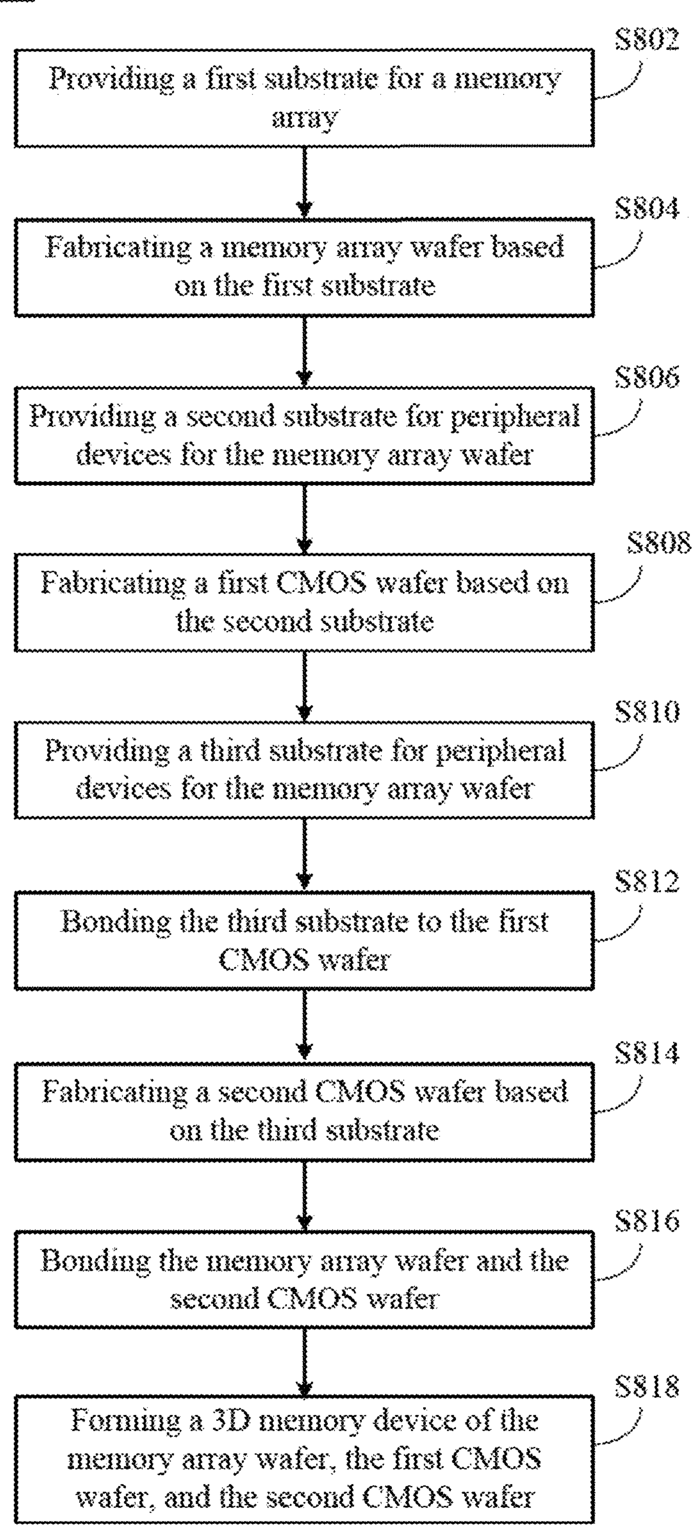
Figure 8A:
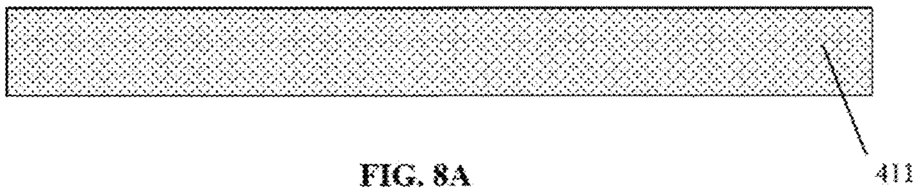

FIG. 8 shows a fabrication process 800 of the 3D memory device 100 consistent with the disclosed embodiments, and FIGS. 8A-8I show various fabrication stages of the fabrication process 800 consistent with the disclose embodiments. As shown in FIG. 8, at S802, also referring to FIG. 8A, a first substrate 411 is provided for fabricating a 3D memory array. The first substrate may be made of a material including silicon, germanium, SiGe, SiC, silicon on insulator (SOI), germanium on insulator (GOI), glass, III-V group compound (e.g., GaN, GaAs, InAs, etc.), or any other appropriate semiconductor material. For example, the first substrate includes a semiconductor substrate, such as a single crystalline silicon substrate. The first substrate 411 may also be a single layer substrate or a multi-layer substrate, for example, a monocrystalline single-layer substrate, a polycrystalline silicon (polysilicon) single-layer substrate, a polysilicon and metal multi-layer substrate, etc.

Figure 8B:
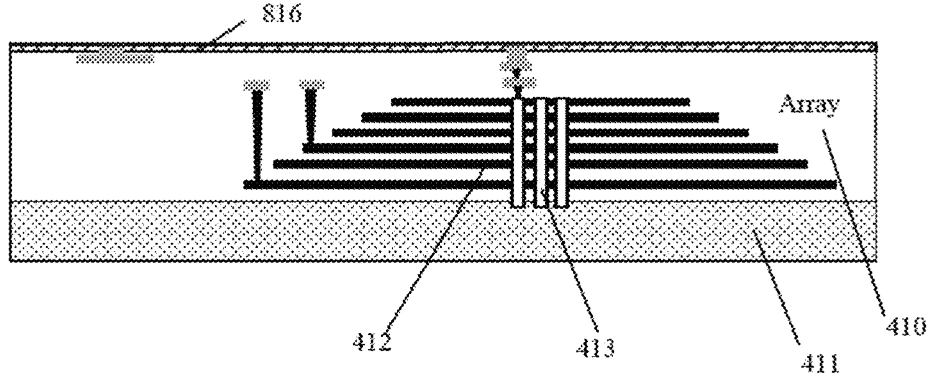

Further, at S804, also referring to FIG. 8B, a memory array wafer 410 is fabricated based on the first substrate 411 to form the memory cell array 412 and corresponding structures of the 3D memory device. For example, the first substrate 411 may include a string region and a cell region, and a string structure 413 may be formed in the string region and memory cells may be formed in the cell region in the form of an array of NAND strings extending vertically above the first substrate. Further, interconnects, such as interconnect contacts and vertical through contracts, may be formed for the vertical direction, and word lines and bit lines may also be formed to connect the string structure and the memory cells.

In one embodiment, an array joint layer 816 may also be formed to include joint structures for later bonding with the CMOS wafer. The array joint layer 816 may be an interconnection layer including one or more joint structures embedded in a dielectric layer. The joint structures may include contacts, single-layer/multi-layer vias, conductive lines, plugs, pads, and/or any other suitable conductive structures that are made by conductive materials including W, Co, Cu, Al, doped silicon, silicides, or any combination thereof. The dielectric layer may include dielectric materials including silicon oxide, silicon nitride, silicon oxynitride, or any combination thereof. The joint structures may be exposed on the top surface of the array joint layer on the array wafer. Other processes and devices may also be performed or formed.

Figure 8C:
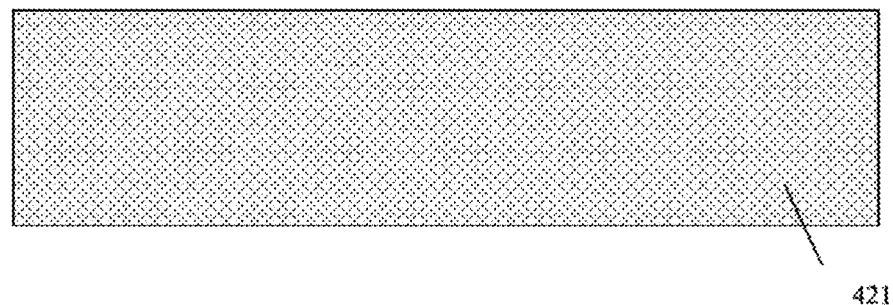

Further, at S806, also referring to FIG. 8C, a second substrate 421 is provided for forming peripheral devices for the memory array wafer 410. The second substrate 421 may include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. The second substrate 421 may be a single layer substrate or a multi-layer substrate, for example, a monocrystalline single-layer substrate, a polycrystalline silicon (polysilicon) single-layer substrate, a polysilicon and metal multi-layer substrate, etc. Other materials may also be used.

Figure 8D:
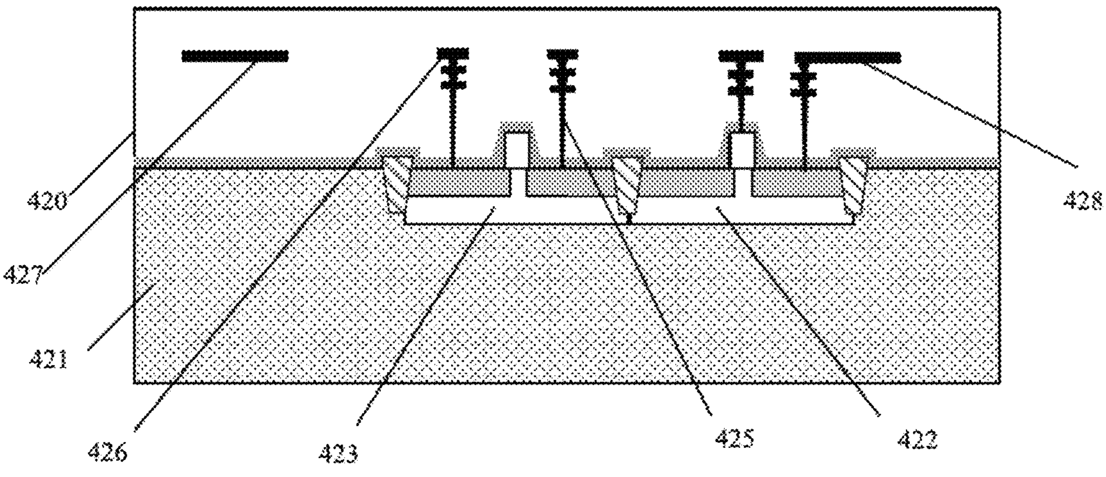

Further, at S808, also referring to FIG. 8D, a first CMOS wafer 420 is fabricated based on the second substrate 421. For example, a peripheral circuit layer may be formed on the second substrate, including plurality of peripheral circuits. The peripheral circuits including any suitable digital, analog, and/or mixed-signal peripheral circuits used for facilitating the operation of the 3D memory device 100. In certain embodiments, the peripheral circuits may include one or more of a page buffer, a decoder (e.g., a row decoder and a column decoder), a latch, a sense amplifier, a driver, a charge pump, a current or voltage reference, or any active or passive components of the circuits (e.g., transistors, diodes, resistors, or capacitors). More specifically, the second substrate may be provided to form HV circuits of the peripheral devices, including HV circuits of page buffers.

Further, at S810, as referring to FIG. 8E, a third substrate 431 is provided for forming peripheral devices for the memory array wafer 410. The third substrate 421 may include any suitable semiconductor material that can include silicon (e.g., monocrystalline silicon, polycrystalline silicon), silicon germanium (SiGe), gallium arsenide (GaAs), germanium (Ge), silicon on insulator (SOI), germanium on insulator (GOI), or any suitable combination thereof. Other materials may also be used.

Further, at S812, also referring to FIG. 8F, the third substrate 431 is bonded to the first CMOS wafer 420. For example, the third substrate 431 may be bonded to the top of the first CMOS wafer 420 and may be thinned to a certain thickness for further fabrication.

Further, at S814, also referring to FIG. 8G, a second CMOS wafer 430 is fabricated based on the second substrate 431. For example, a peripheral circuit layer may be formed on the third substrate, including plurality of peripheral circuits. The peripheral circuits including any suitable digital, analog, and/or mixed-signal peripheral circuits used for facilitating the operation of the 3D memory device 100. In certain embodiments, the peripheral circuits in the second CMOS wafer 430 may include LLV circuits and LV circuits of the peripheral devices for the 3D memory device 100, such as LV circuits of the page buffers.

Further, a CMOS joint layer 826 may also be formed. The CMOS joint layer may be an interconnection layer including one or more joint structures embedded in a dielectric layer. The joint structures 832 may include contacts, single-layer/multi-layer vias, conductive lines, plugs, pads, and/or any other suitable conductive structures that are made by conductive materials including W, Co, Cu, Al, doped silicon, silicides, or any combination thereof. The dielectric layer may include dielectric materials including silicon oxide, silicon nitride, silicon oxynitride, or any combination thereof. One or more portions of the joint structures may be exposed on the top surface of the CMOS joint layer on the CMOS wafer.

Figure 8H:
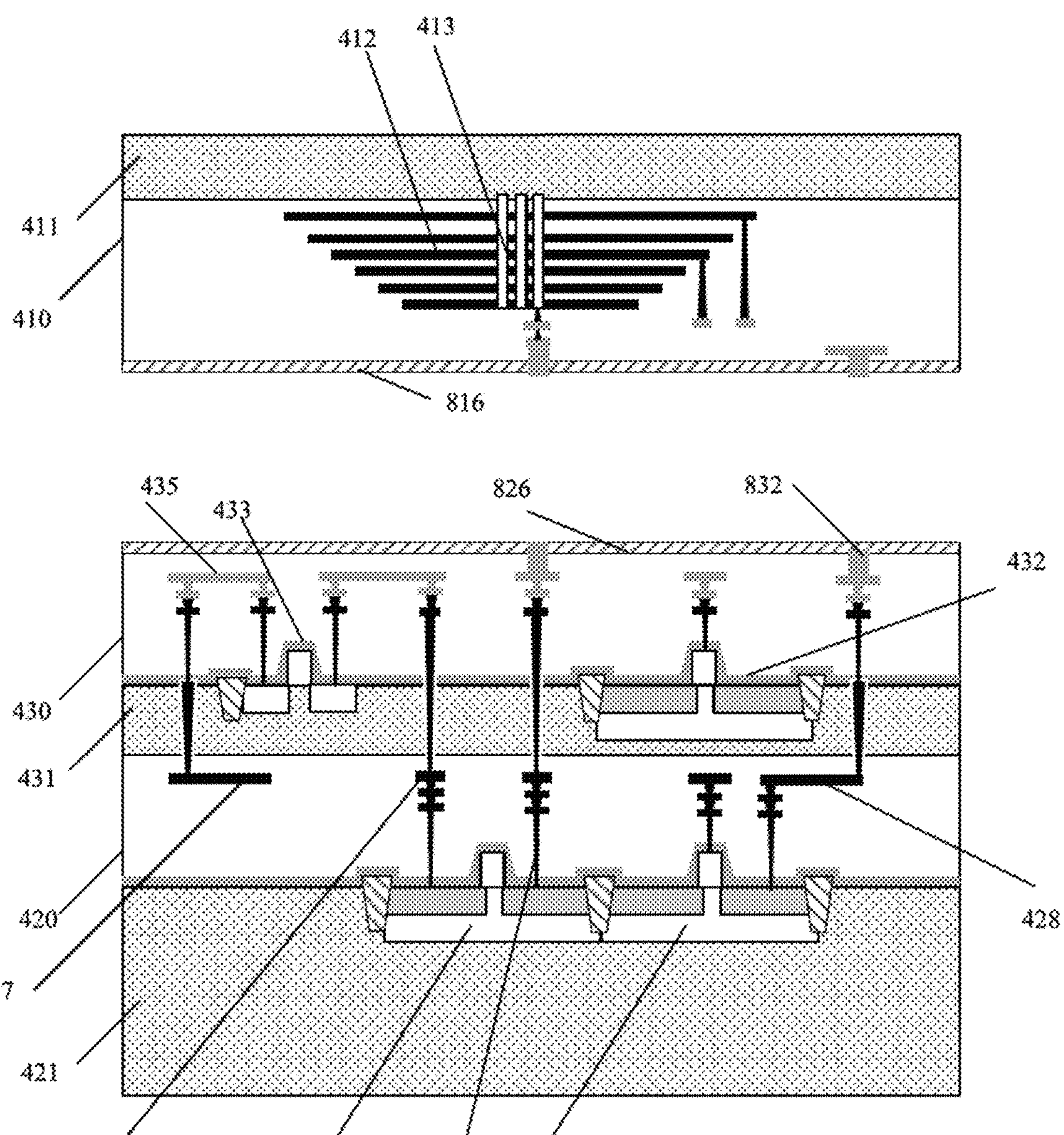

Further, at S816, also referring to FIG. 8H, the memory array wafer 110 and the second CMOS wafer 430 are bonded together to form a 3D memory device 100. For example, the array wafer 410 may be flipped over to face down towards the second CMOS wafer 430 for bonding the array joint layer 816 of the array wafer 410 to the CMOS joint layer 826 of the second CMOS wafer 430. The bonding interface is between the array joint layer and the CMOS joint layer. Therefore, the bonding interface includes both the interface between two dielectric layers (e.g., between a silicon nitride layer and a silicon oxide layer) and the interface between two conductive layers (e.g., between metal contacts). In some embodiments, one or more joint structures in the array wafer and one or more joint structures in the second CMOS wafer can be contacted with each other at bonding interface for electrical connection.

Figure 8I:
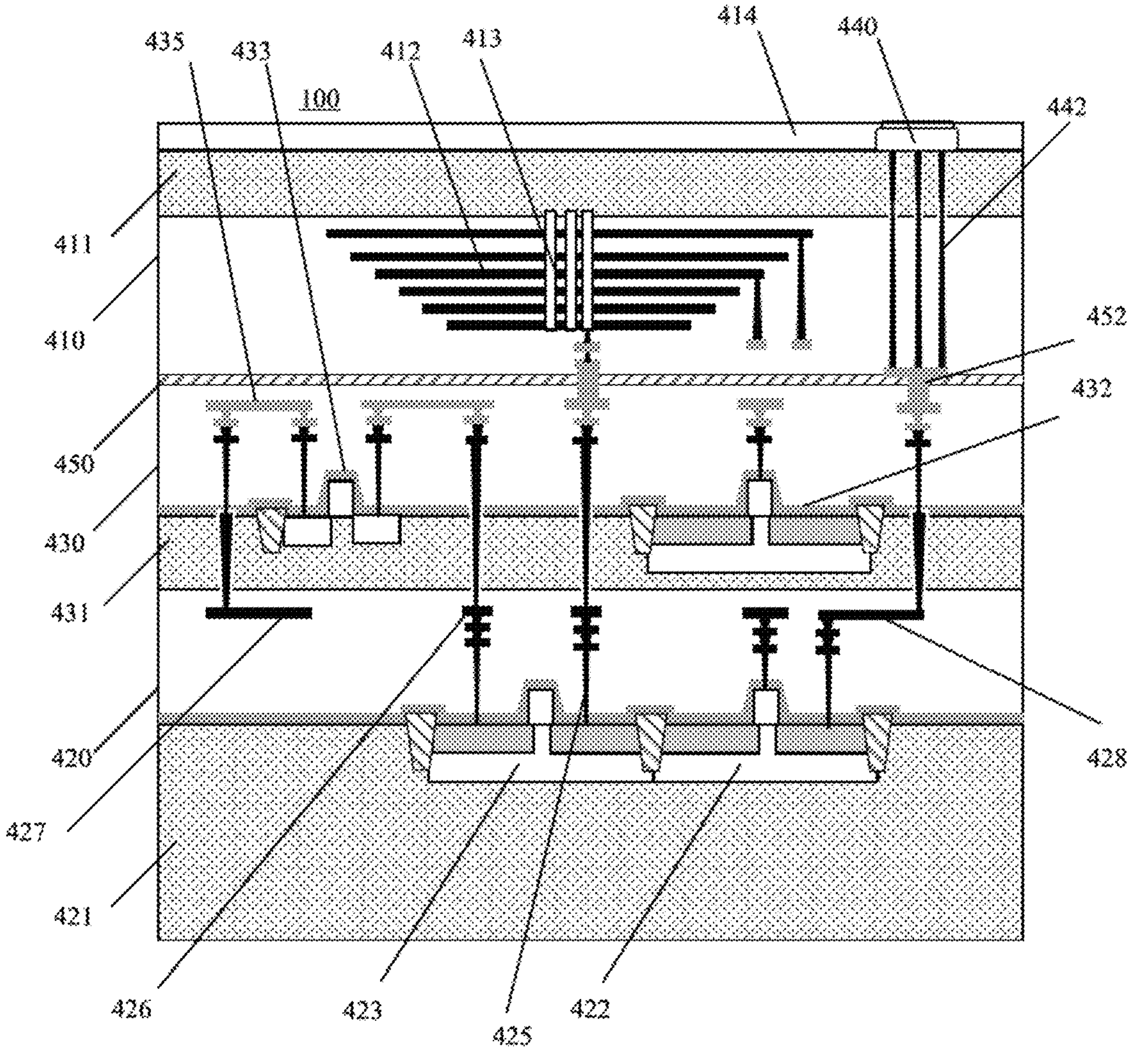

Further, at S818, also referring to FIG. 8I, a 3D memory device 100 is formed from the bonded memory array wafer 410 and the first CMOS wafer 420 and the second CMOS wafer 430. For example, the first substrate 411 may be thinned by one or more suitable processes, and at least one through substrate contact (TSC) 442 may be formed to penetrate the first substrate 411 to connect with the devices of the array wafer 410 and/or devices of the first CMOS wafer 420 and the second CMOS wafer 430. Further, an isolating layer 414 may be formed to cover the first substrate and the at least one through substrate contact. The isolating layer 414 may include dielectric materials including silicon oxide, silicon nitride, silicon oxynitride, or any combination thereof. Further, a plurality of array pads 440 may be formed in contact with the least one through substrate contact 442, and the array pads 440 may be used for external input/output terminals.

Figure 9:
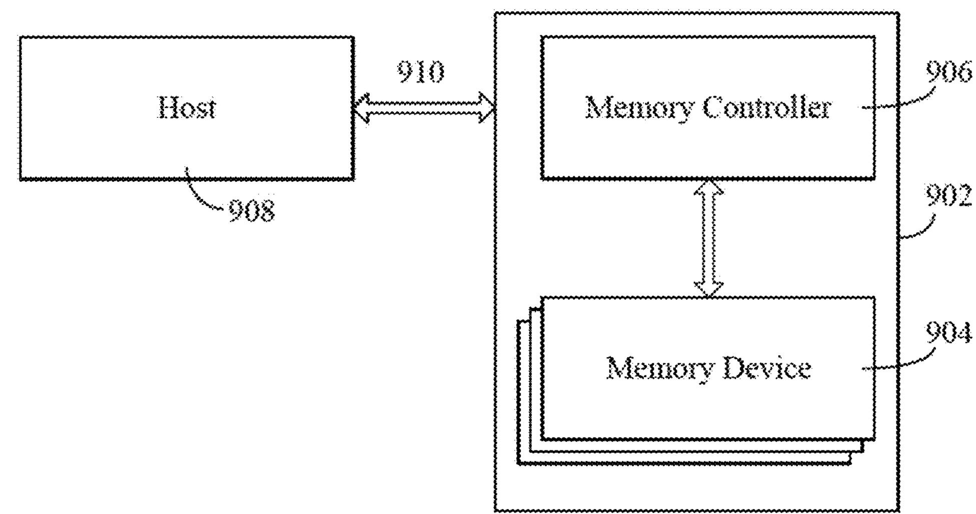
FIG. 9 illustrates a block diagram of an exemplary system having a memory device consistent with various disclosed embodiments in the present disclosure.

The above fabricated 3D memory device may be a part of other memory systems. FIG. 9 shows a block diagram of an exemplary system 900 having a memory device according to various aspects of the present disclosure. The system 900 may be a mobile phone (e.g., a smartphone), a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 9, the system 900 may include a host 908 and a memory system 902 having one or more memory devices 904 and a memory controller 906. The host 908 may be a processor of an electronic device, such as a central processing unit (CPU), or a system-on-chip (SoC), such as an application processor (AP). The host 908 may be configured to send or receive data to or from the memory devices 904.

The memory controller 906 is coupled to the memory devices 904 and host 908 and is configured to control the memory devices 904, according to some implementations. The memory controller 906 may also be integrated into the memory devices 904. The memory controller 906 may manage the data stored in the memory devices 904 and communicate with the host 908 with an interface 910. In some embodiments, the memory controller 906 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some other embodiments, the memory controller 906 is designed for operating in a high duty-cycle environment, such as solid-state drives (SSDs) or embedded multi-media-cards (eMMCs) used as data storage for mobile devices, such as smartphones, tablets, laptop computers, etc., and enterprise storage arrays. The memory controller 906 may be configured to control operations of the memory device 904, such as read, erase, and program operations.

Figure 10:
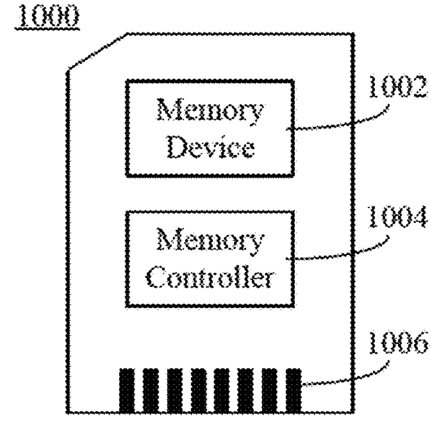
FIG. 10 illustrates a block diagram of an exemplary memory card having a memory device consistent with various disclosed embodiments in the present disclosure.
Figure 11:
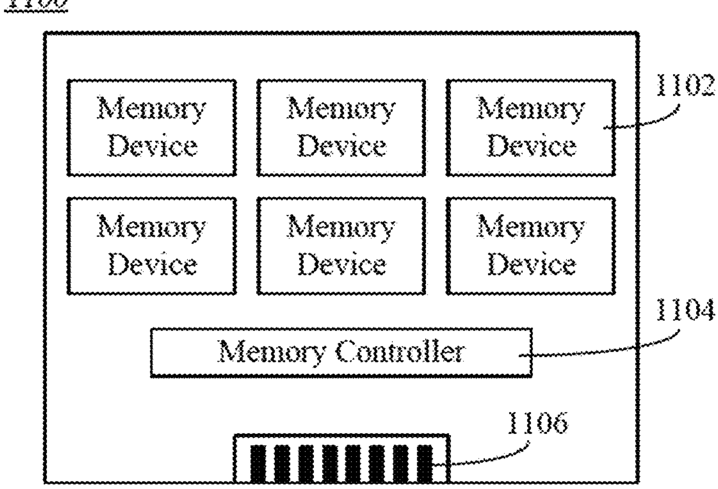
FIG. 11 illustrates a block diagram of an exemplary solid state disk (SSD) having a memory device consistent with various disclosed embodiments in the present disclosure.

The memory device 904 may be any memory device disclosed in the present disclosure. The memory controller 906 and one or more memory devices 904 may be integrated into various types of storage devices, for example, be included in the same package, such as a universal Flash storage (UFS) package or an eMMC package. That is, the memory system 902 may be implemented and packaged into different types of end electronic products. FIGS. 10 and 11 exemplarily illustrate block diagrams of a memory card 1000 and an SSD 1100 according to various aspects of the present disclosure. As shown in FIG. 10, a memory controller 1004 and a single memory device 1002 may be integrated into the memory card 1000. The memory device 1002 may include any memory device disclosed in the present disclosure. The memory card 1000 may include a PC card (personal computer memory card international association (PCMCIA)), a CF card, a smart media (SM) card, a memory stick, a multimedia card (MMC, RS-MMC, or MMCmicro), an SD card (SD, miniSD, microSD, or SDHC), a UFS, etc. The memory card 1000 may further include a memory card interface or interface connector 1006 configured to couple the memory card 1000 to a host (e.g., the host 908 shown in FIG. 9). As shown in FIG. 11, a memory controller 1104 and multiple memory devices 1102 may be integrated into the SSD 1100. The memory devices 1102 may include any aforementioned memory device disclosed in the present disclosure. The SSD 1100 may further include an SSD interface or interface connector 1106 configured to couple the SSD 1100 to a host (e.g., the host 908 shown in FIG. 9).

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a three-dimensional (3D) memory device, comprising:

forming an array wafer based on a first substrate having at least one cell region for forming a plurality of memory cells and at least one stair structure region for forming a stair structure, including: forming the plurality of memory cells in the at least one cell region, and forming the stair structure in the at least one stair structure region;

forming a first complementary metal-oxide-semiconductor (CMOS) wafer based on a second substrate having at least one string driver region corresponding to the at least one stair structure region, and at least one page buffer high-voltage (HV) circuit region corresponding to the at least one cell region, including: forming HV circuits of a string driver in the at least one string driver region, and forming HV circuits of page buffers in the at least one page buffer HV circuit region;

forming a second CMOS wafer based on a third substrate having at least one page buffer region corresponding to the at least one cell region, including forming low-voltage (LV) circuits of the page buffers in the at least one page buffer region; and forming the 3D memory device based on the array wafer, the first CMOS wafer, and the second CMOS wafer, wherein the array wafer, the first CMOS wafer, and the second CMOS wafer are stacked together, wherein the forming the 3D memory device further comprises: forming an isolating layer over the first substrate; forming at least one through substrate contact penetrating the first substrate; and forming one or more array pads in contact with the at least one through substrate contact, wherein the forming the second CMOS wafer further comprises:

bonding the third substrate to the first CMOS wafer; and forming the LV circuits of the page buffer on the third substrate and in the at least one page buffer region, wherein the first CMOS wafer and the second CMOS wafer form a bonded first CMOS wafer and second CMOS wafer, wherein the forming the 3D memory device further comprises:

bonding the array wafer to the bonded first CMOS wafer and second CMOS wafer at a bonding interface, such that a top surface of the array wafer is bonded to a top surface of the second CMOS wafer, and the first substrate is at top of the bonded array wafer and second CMOS wafer.

2. The method according to claim 1, wherein the at least one cell region are two side portions of the array wafer, and the at least one stair structure region is a single center portion of the array wafer;

the at least one string driver region is a single center portion of the first CMOS wafer;

the at least one page buffer HV circuit region are four side portions of the first CMOS wafer for forming the HV circuits of the page buffers; and the at least one page buffer region are two side portions of the second CMOS wafer for forming the LV circuits of the page buffers, wherein the at least one page buffer region includes four through silicon connects (TSC) regions to connect the HV circuits of the page buffers in the four side portions of first CMOS wafer and the LV circuits of the page buffers in the two side portions of the second CMOS wafer.

3. The method according to claim 1, wherein the at least one cell region are two side portions of the array wafer, and the at least one stair structure region is a single center portion of the array wafer;

the at least one string driver region are two staggered regions at a center portion of the first CMOS wafer;

the at least one page buffer HV circuit region are two side portions of the first CMOS wafer for forming the HV circuits of the page buffers; and the at least one page buffer region are two side portions of the second CMOS wafer for forming the LV circuits of the page buffers, wherein the at least one page buffer region includes two through silicon connects (TSC) regions to connect the HV circuits of the page buffers in the two side portions of first CMOS wafer and the LV circuits of the page buffers in the two side portions of the second CMOS wafer.

4. The method according to claim 1, wherein:

the at least one cell region is a single center portion of the array wafer, and the at least one stair structure region are two side portions of the array wafer;

the at least one string driver region are two side portions of the first CMOS wafer;

the at least one page buffer HV circuit region are two center portions of the first CMOS wafer for forming the HV circuits of the page buffers; and the at least one page buffer region is one center portion of the second CMOS wafer for forming the LV circuits of the page buffers, wherein the at least one page buffer region includes two through silicon connects (TSC) regions to connect the HV circuits of the page buffers in the two center portions of first CMOS wafer and the LV circuits of the page buffers in the one center portion of the second CMOS wafer.

5. The method according to claim 1, wherein:

the at least one cell region is a single center portion of the array wafer, and the at least one stair structure region are two side portions of the array wafer;

the at least one string driver region are two side portions of the first CMOS wafer;

the at least one page buffer HV circuit region are two center portions of the first CMOS wafer for forming the HV circuits of the page buffers; and the at least one page buffer region are two center portions of the second CMOS wafer for forming the LV circuits of the page buffers, wherein the at least one page buffer region includes two through silicon connects (TSC) regions to connect the HV circuits of the page buffers in the two center portions of first CMOS wafer and the LV circuits of the page buffers in the two center portions of the second CMOS wafer.

6. The method according to claim 1, wherein:
the at least one cell region are two side portions of the array wafer, and the at least one stair structure region is a single center portion of the array wafer; and
the second CMOS wafer further includes a controller in memory (CIM) structure formed in at least one CIM region of the third substrate to provide control functions for the 3D memory device,
wherein the at least one CIM region are two side portions of the second CMOS wafer.

7. The method according to claim 1, wherein:
the at least one cell region is a single center portion of the array wafer, and the at least one stair structure region are two side portions of the array wafer; and
the second CMOS wafer further includes a controller in memory (CIM) structure formed in at least one CIM region of the third substrate to provide control functions for the 3D memory device,
wherein the at least one CIM region is a lower center portion of the second CMOS wafer.

8. A three-dimensional (3D) memory device, comprising:
an array wafer including a first substrate having at least one cell region and at least one stair structure region, a plurality of memory cells formed in the at least one cell region, and a stair structure formed in the at least one stair structure region;
a first complementary metal-oxide-semiconductor (CMOS) wafer including a second substrate having at least one string driver region corresponding to the at least one stair structure region and at least one page buffer high-voltage (HV) circuit region corresponding to the at least one cell region, HV circuits of a string driver formed in the at least one string driver region, and HV circuits of page buffers formed in the at least one page buffer HV circuit region; and
a second CMOS wafer including a third substrate having at least one page buffer region corresponding to the at least one cell region, and low-voltage (LV) circuits of the page buffers formed in the at least one page buffer region;
wherein the array wafer, the first CMOS wafer, and the second CMOS wafer are stacked together, and
wherein the 3D memory device further comprises: an isolating layer formed over the first substrate; at least one through substrate contact penetrating the first substrate; and one or more array pads in contact with the at least one through substrate contact,
wherein:
the third substrate is combined with the first CMOS wafer;
the LV circuits of the page buffer are formed on the third substrate and in the at least one page buffer region;
the first CMOS wafer and the second CMOS wafer form a bonded first CMOS wafer and second CMOS wafer; and
the array wafer is bonded to the bonded first CMOS wafer and second CMOS wafer at a bonding interface.

9. The 3D memory device according to claim 8, wherein
the at least one cell region are two side portions of the array wafer, and the at least one stair structure region is a single center portion of the array wafer;
the at least one string driver region is a single center portion of the first CMOS wafer;
the at least one page buffer HV circuit region are four side portions of the first CMOS wafer for forming the HV circuits of the page buffers; and
the at least one page buffer region are two side portions of the second CMOS wafer for forming the LV circuits of the page buffers,
wherein the at least one page buffer region includes four through silicon connects (TSC) regions to connect the HV circuits of the page buffers in the four side portions of first CMOS wafer and the LV circuits of the page buffers in the two side portions of the second CMOS wafer.

10. The 3D memory device according to claim 8, wherein,
the at least one cell region are two side portions of the array wafer, and the at least one stair structure region is a single center portion of the array wafer;
the at least one string driver region are two staggered regions at a center portion of the first CMOS wafer;
the at least one page buffer HV circuit region are two side portions of the first CMOS wafer for forming the HV circuits of the page buffers; and
the at least one page buffer region are two side portions of the second CMOS wafer for forming the LV circuits of the page buffers,
wherein the at least one page buffer region includes two through silicon connects (TSC) regions to connect the HV circuits of the page buffers in the two side portions of first CMOS wafer and the LV circuits of the page buffers in the two side portions of the second CMOS wafer.

11. The 3D memory device according to claim 8, wherein,
the at least one cell region is a single center portion of the array wafer, and the at least one stair structure region are two side portions of the array wafer;
the at least one string driver region are two side portions of the first CMOS wafer;
the at least one page buffer HV circuit region are two center portions of the first CMOS wafer for forming the HV circuits of the page buffers; and
the at least one page buffer region is one center portion of the second CMOS wafer for forming the LV circuits of the page buffers,
wherein the at least one page buffer region includes two through silicon connects (TSC) regions to connect the HV circuits of the page buffers in the two center portions of first CMOS wafer and the LV circuits of the page buffers in the one center portion of the second CMOS wafer.

12. The 3D memory device according to claim 8, wherein,
the at least one cell region is a single center portion of the array wafer, and the at least one stair structure region are two side portions of the array wafer;
the at least one string driver region are two side portions of the first CMOS wafer;
the at least one page buffer HV circuit region are two center portions of the first CMOS wafer for forming the HV circuits of the page buffers; and
the at least one page buffer region are two center portions of the second CMOS wafer for forming the LV circuits of the page buffers,
wherein the at least one page buffer region includes two through silicon connects (TSC) regions to connect the HV circuits of the page buffers in the two center portions of first CMOS wafer and the LV circuits of the page buffers in the two center portions of the second CMOS wafer.

13. The 3D memory device according to claim 8, wherein:
the at least one cell region are two side portions of the array wafer, and the at least one stair structure region is a single center portion of the array wafer; and the second CMOS wafer further includes a controller in memory (CIM) structure formed in at least one CIM region of the third substrate to provide control functions for the 3D memory device, wherein the at least one CIM region are two side portions of the second CMOS wafer.

14. The 3D memory device according to claim 8, wherein:

the at least one cell region is a single center portion of the array wafer, and the at least one stair structure region are two side portions of the array wafer; and the second CMOS wafer further includes a controller in memory (CIM) structure formed in at least one CIM region of the third substrate to provide control functions for the 3D memory device, wherein the at least one CIM region is a lower center portion of the second CMOS wafer.

15. A memory system, comprising:

a 3D memory device, including an array wafer, a first complementary metal-oxide-semiconductor (CMOS) wafer, and a second CMOS wafer stacked together, the array wafer including a first substrate having at least one cell region and at least one stair structure region, a plurality of memory cells formed in the at least one cell region, and a stair structure formed in the at least one stair structure region; the first CMOS wafer including a second substrate having at least one string driver region corresponding to the at least one stair structure region and at least one page buffer high-voltage (HV) circuit region corresponding to the at least one cell region, HV circuits of a string driver formed in the at least one string driver region, and HV circuits of page buffers formed in the at least one page buffer HV circuit region; and the second CMOS wafer including a third substrate having at least one page buffer region corresponding to the at least one cell region, and low-voltage (LV) circuits of the page buffers formed in the at least one page buffer region, wherein the 3D memory device further comprises: an isolating layer formed over the first substrate; at least one through substrate contact penetrating the first substrate; and one or more array pads in contact with the at least one through substrate contact, wherein the third substrate is combined with the first CMOS wafer; the LV circuits of the page buffer are formed on the third substrate and in the at least one page buffer region; the first CMOS wafer and the second CMOS wafer form a bonded first CMOS wafer and second CMOS wafer; and the array wafer is bonded to the bonded first CMOS wafer and second CMOS wafer at a bonding interface;

a memory controller coupled to the 3D memory device for controlling the 3D memory device; and an external interface for communicating with a host for storing information in the 3D memory device.

16. The memory system according to claim 15, wherein the external interface includes one of universal serial bus (USB), secure digital (SD), compact flash (CF), solid state drive (SSD), and embedded multi-media-card (eMMC).

* * * * *